United States Patent
Lee

(10) Patent No.: US 11,948,957 B2
(45) Date of Patent: Apr. 2, 2024

(54) IMAGE SENSOR

(71) Applicant: SAMSUNG ELECTRONICS CO., LTD., Suwon-si (KR)

(72) Inventor: Youngmi Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 308 days.

(21) Appl. No.: 17/370,167

(22) Filed: Jul. 8, 2021

(65) Prior Publication Data
US 2022/0165761 A1 May 26, 2022

(30) Foreign Application Priority Data

Nov. 23, 2020 (KR) .................. 10-2020-0158052

(51) Int. Cl.
*H01L 31/036* (2006.01)
*H01L 27/146* (2006.01)

(52) U.S. Cl.
CPC .... *H01L 27/1463* (2013.01); *H01L 27/14685* (2013.01)

(58) Field of Classification Search
None
See application file for complete search history.

(56) References Cited

U.S. PATENT DOCUMENTS

| | | | |
|---|---|---|---|
| 8,258,558 B2 | 9/2012 | Kim | |
| 9,025,063 B2 | 5/2015 | Ahn et al. | |
| 9,508,770 B2 | 11/2016 | Yanagita et al. | |
| 9,609,250 B2 | 3/2017 | Lee et al. | |
| 10,032,819 B2 | 7/2018 | Lee et al. | |
| 10,051,215 B2 | 8/2018 | Yun et al. | |
| 10,128,288 B2 | 11/2018 | Oh et al. | |
| 2010/0133592 A1* | 6/2010 | Mori | H01L 27/1463 257/E31.04 |
| 2011/0049668 A1* | 3/2011 | Lin | H01L 21/76224 257/E21.546 |
| 2012/0098084 A1* | 4/2012 | Lerner | H01L 21/76224 257/E29.02 |
| 2014/0246707 A1* | 9/2014 | Koo | H01L 27/14689 257/230 |
| 2015/0035102 A1* | 2/2015 | Ashidate | H01L 27/14603 257/432 |

(Continued)

FOREIGN PATENT DOCUMENTS

KR 10-2017-0089208 8/2017

*Primary Examiner* — Ali Naraghi
(74) *Attorney, Agent, or Firm* — F. Chau & Associates, LLC

(57) ABSTRACT

An image sensor includes a substrate having a first surface and a second surface facing each other. A deep trench extends from the first surface to the second surface of the substrate and defines a pixel region within the substrate. A photoelectric conversion region is disposed within the pixel region. A shallow trench extends from the first surface of the substrate into the substrate and at least partially defines a pattern within the pixel region. In a plan view, the pattern has a first corner, a second corner facing the first corner in a first diagonal direction, a third corner, and a fourth corner facing the third corner in a second diagonal direction that crosses the first diagonal direction. In the plan view, a radius of curvature of the third corner is less than a radius of curvature of the first corner.

20 Claims, 29 Drawing Sheets

(56) References Cited

U.S. PATENT DOCUMENTS

2016/0211303 A1* 7/2016 Enomoto .......... H01L 27/14689
2018/0366365 A1* 12/2018 Goutaudier ............ H01L 33/08
2022/0130885 A1* 4/2022 Zang ................ H01L 27/14614

* cited by examiner

IMAGE SENSOR

CROSS-REFERENCE TO RELATED APPLICATION

This application claims priority under 35 U.S.C. § 119 to Korean Patent Application No. 10-2020-0158052, filed on Nov. 23, 2020 in the Korean Intellectual Property Office, the disclosure of which is incorporated by reference in its entirety herein.

TECHNICAL FIELD

The present inventive concepts relate to an image sensor. More specifically, the present inventive concepts relate to a complementary metal-oxide-semiconductor (CMOS) image sensor.

DISCUSSION OF RELATED ART

An image sensor may include a charge coupled device (CCD) image sensor or a CMOS image sensor. A CMOS image sensor may have a relatively simple driving method, and a signal processing circuit may be integrated on a single chip. Therefore, the size of the CMOS image sensor may be relatively small. The CMOS image sensor also has relatively low power consumption, and thus, it can be applied to products with limited battery capacity. In addition, the CMOS image sensor is compatible with CMOS process technology, thereby reducing the manufacturing cost. In addition, as the CMOS image sensor can realize a high resolution, consumer demand for a CMOS image sensor is increasing as technology advances.

SUMMARY

The present inventive concepts provide an image sensor structure and a method of manufacturing an image sensor for increasing the yield of a process of firming patterns in a substrate.

According to an embodiment of the present inventive concepts, an image sensor includes a substrate having a first surface and a second surface facing each other. A deep trench extends from the first surface to the second surface of the substrate and is configured to define a pixel region within the substrate. A photoelectric conversion region is disposed within the pixel region. A shallow trench extends from the first surface of the substrate into the substrate and is configured to at least partially define a pattern within the pixel region. In a plan view, the pattern has a first corner, a second corner facing the first corner in a first diagonal direction, a third corner, and a fourth corner facing the third corner in a second diagonal direction that crosses the first diagonal direction. In the plan view, a radius of curvature of the third corner is less than a radius of curvature of the first corner.

According to an embodiment of the present inventive concepts, an image sensor includes a substrate having a first surface and a second surface facing each other. A deep trench extends from the first surface to the second surface of the substrate and is configured to define a first pixel region within the substrate. A first photoelectric conversion region is disposed within the first pixel region. A first shallow trench extends from the first surface of the substrate into the substrate and is configured to at least partially define a first pattern in the first pixel region. In a plan view, the first pattern comprises a first corner, a second corner separated from the first corner in a first horizontal direction, a third corner separated from the first corner in a second horizontal direction that crosses the first horizontal direction, and a fourth corner separated from the second corner in the second horizontal direction and separated from the third corner in the first horizontal direction. In the plan view, a radius of curvature of the second corner is less than a radius of curvature of the first corner.

According to an embodiment of the present inventive concepts, an image sensor includes a substrate having a first pixel region, a second pixel region separated from the first pixel region in a first horizontal direction, a third pixel region separated from the first pixel region in a second horizontal direction that crosses the first horizontal direction, and a fourth pixel region separated from the second pixel region in the second horizontal direction and separated from the third pixel region in the first horizontal direction. A pixel separation structure is configured to define the first to fourth pixel regions. First to fourth photoelectric conversion regions are respectively disposed within the first to fourth pixel regions. A device isolation layer is configured to define first to fourth patterns in the first to fourth pixel regions, respectively. In a plan view, each of the first to fourth patters comprises a first corner, a second corner separated from the first corner in the first horizontal direction, a third corner separated from the first corner in the second horizontal direction, and a fourth corner separated from the second corner in the second horizontal direction and separated from the third corner in the first horizontal direction. A radius of curvature of the second corner of the first pattern and a radius of curvature of the third corner of the first pattern are less than a radius of curvature of the first corner of the first pattern and a radius of curvature of the fourth corner of the first pattern. A radius of curvature of the first corner of the second pattern and a radius of curvature of the fourth corner of the second pattern are less than a radius of curvature of the second corner of the second pattern and a radius of curvature of the third corner of the second pattern. A radius of curvature of the first corner of the third pattern and a radius of curvature of the fourth corner of the third pattern are less than a radius of curvature of the second corner of the third pattern and a radius of curvature of the third corner of the third pattern. A radius of curvature of the second corner of the fourth pattern and a radius of curvature of the third corner of the fourth pattern are less than a radius of curvature of the first corner of the fourth pattern and a radius of curvature of the fourth corner of the fourth pattern.

According to an embodiment of the present inventive concepts, an image sensor includes a substrate having a first surface and a second surface facing each other. A deep trench extends from the first surface to the second surface of the substrate and is configured to define a plurality of pixel regions within the substrate. A plurality of shallow trenches extends from the first surface of the substrate into the substrate and is configured to at least partially define a plurality of patterns within each pixel region of the plurality of pixel regions. The plurality of patterns are configured to ground a transistor of the image sensor. In a plan view, each pattern of the plurality of patterns has a shape having a plurality of corners. Each pattern of the plurality of patterns has at least one corner that has a radius of curvature that is less than a radius of curvature of another corner of the plurality of corners of the pattern of the plurality of patterns.

BRIEF DESCRIPTION OF THE DRAWINGS

Embodiments of the present inventive concepts will be more clearly understood from the following detailed description taken in conjunction with the accompanying drawings in which.

DETAILED DESCRIPTION OF EMBODIMENTS

Figure 1A:
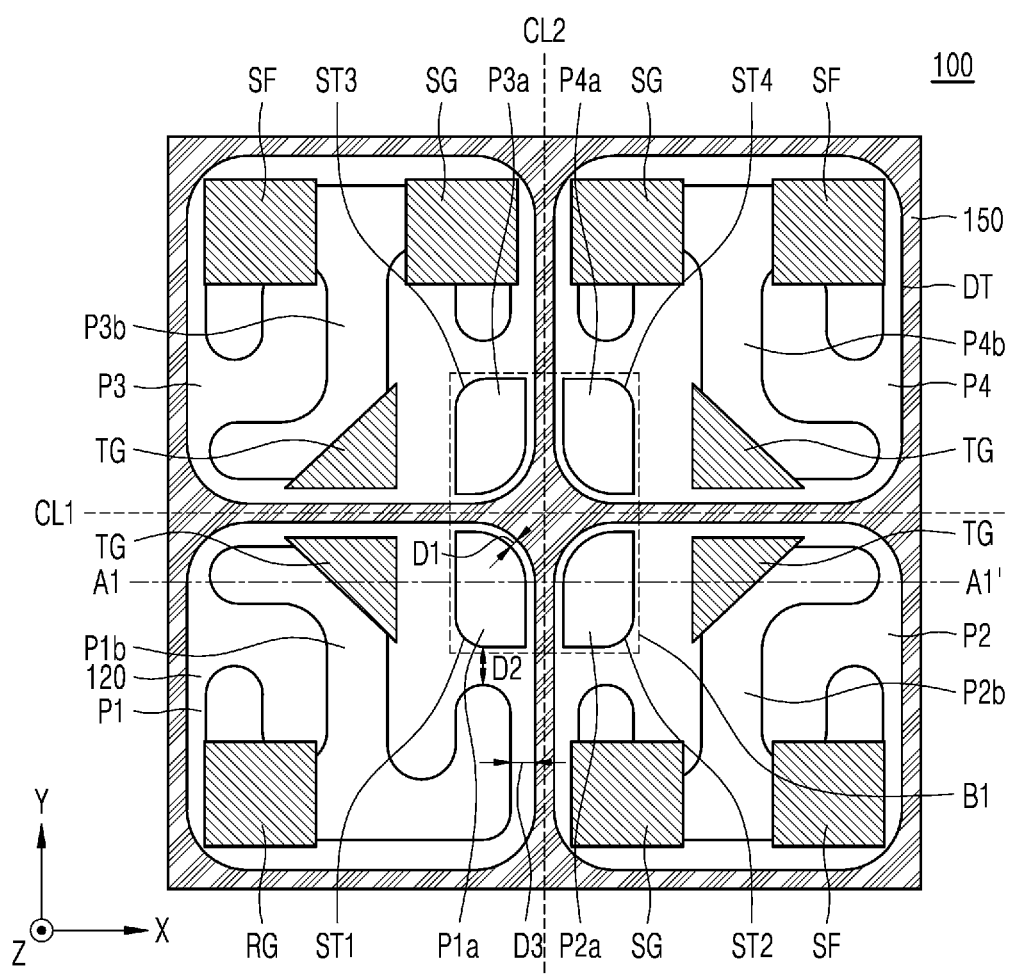
FIG. 1A is a plan view of an image sensor according to an embodiment of the present inventive concepts.
Figure 1B:
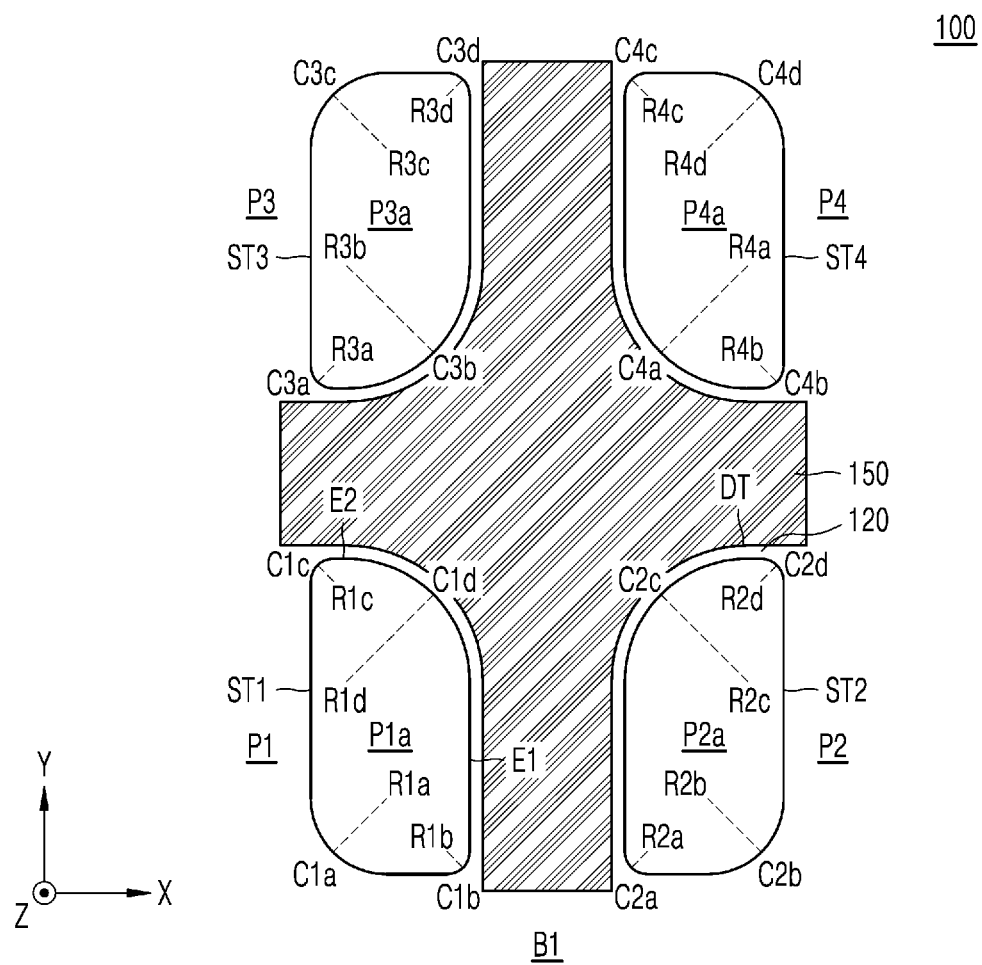
FIG. 1B is an enlarged view of an area B1 of FIG. 1A according to an embodiment of the present inventive concepts.
Figure 1C:
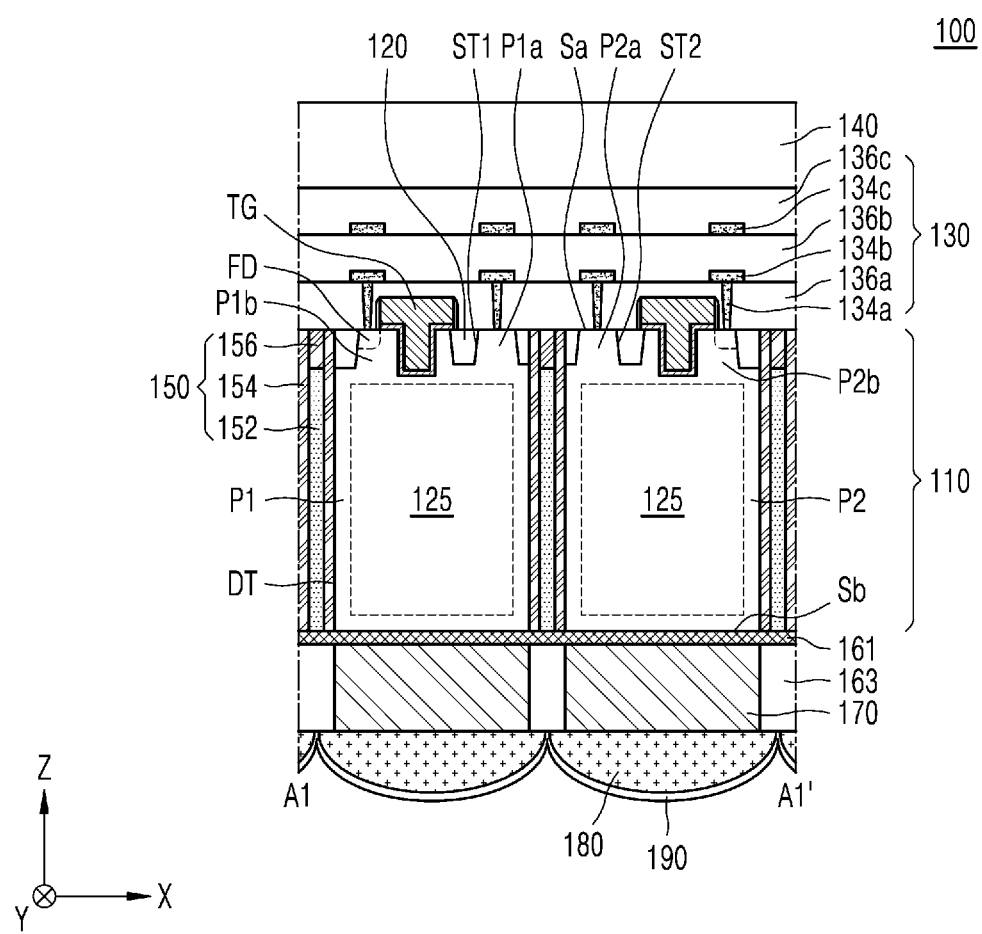
FIG. 1C is a cross-sectional view taken along a line A1-A1' of FIG. 1A.

FIG. 1A is a plan view of an image sensor 100 according to embodiments of the present inventive concepts. FIG. 1B is an enlarged view of an area B1 of FIG. 1A. FIG. 1C is a cross-sectional view taken along a line A1-A1' of FIG. 1A.

Referring to the embodiments of FIGS. 1A to 1C, the image sensor 100 may include a substrate 110. The substrate 110 may have a first surface Sa and a second surface Sb facing each other. For example, the first surface Sa and the second surface Sb may be spaced apart from each other in a thickness direction of the image sensor 100 that is parallel to the Z axis (hereinafter, the "Z direction"). In an embodiment, the substrate 110 may include a semiconductor material such as a group IV semiconductor material, a group III-V semiconductor material, or a group II-VI semiconductor material. The group IV semiconductor material may include, for example, at least one compound selected from silicon (Si), germanium (Ge) and silicon (Si)-germanium (Ge). The group III-V semiconductor material may include, for example, at least one compound selected from gallium arsenide (GaAs), indium phosphorus (InP), gallium phosphorus (GaP), indium arsenic (InAs), indium antimony (InSb) and indium gallium arsenide (InGaAs). The group II-VI semiconductor material may include, for example, at least one compound selected from zinc telluride (ZnTe) and cadmium sulfide (CdS). However, embodiments of the present inventive concepts are not limited thereto.

The image sensor 100 may further include a deep trench DT defining a plurality of pixel regions P1 to P4 in the substrate 110. The deep trench DT may extend from the first surface Sa to the second surface Sb of the substrate 110. For example, the deep trench DT may penetrate the substrate 110 (e.g., completely penetrate the substrate 110 in the Z direction). The plurality of pixel regions P1 to P4 may include a first pixel region P1 and a second pixel region P2 separated from the first pixel region P1 in a first horizontal direction parallel to the X axis (hereinafter, the "X direction"). A third pixel region P3 is separated from the first pixel region P1 in a second horizontal direction parallel to the Y axis (hereinafter, the "Y direction"). A fourth pixel region P4 is separated from the second pixel region P2 in the y direction and separated from the third pixel region P3 in the X direction. The deep trench DT may separate the plurality of pixel regions P1 to P4 from each other.

The image sensor 100 may further include a pixel separation structure 150 disposed in the deep trench DT. In a plan view, the pixel separation structure 150 may completely surround each of the pixel regions P1 to P4 (e.g., in the X and Y directions). The pixel separation structure 150 may define the plurality of pixel regions P1 to P4. The pixel separation structure 150 may separate the plurality of pixel regions P1 to P4 from each other. The pixel separation structure 150 may prevent crosstalk between adjacent pixels of the plurality of pixel regions P1 to P4.

As shown in the embodiment of FIG. 1C, the pixel separation structure 150 may include an insulating pattern 154, a conductive pattern 152, and a capping pattern 156. The insulating pattern 154 may cover the inner wall of the deep trench DT. The capping pattern 156 may fill the upper portion of the deep trench DT. The conductive pattern 152 may fill the lower portion of the deep trench DT. The upper surface of the capping pattern 156 may be coplanar (e.g., in the Z direction) with the first surface Sa of the substrate 110, and the lower surface of the conductive pattern 152 may be coplanar (e.g., in the Z direction) with the second surface Sb of the substrate 110. The insulating pattern 154 may extend from the first surface Sa to the second surface Sb of the substrate 110 (e.g., in the Z direction). The conductive pattern 152 may be separated from the substrate 110 by the insulating pattern 154. However, embodiments of the present inventive concepts are not limited thereto. For example, in some embodiments, the capping pattern 156 may be omitted.

In an embodiment, the conductive pattern 152 may include a semiconductor material or a metal material such as polysilicon doped n-type or p-type, for example. In an embodiment, the insulating pattern 154 and the capping pattern 156 may include silicon oxide, silicon nitride, and silicon oxynitride. However, embodiments of the present inventive concepts are not limited thereto. For example, in some embodiments, the insulating pattern 154 may include a metal oxide such as at least one compound selected from hafnium oxide, aluminum oxide, tantalum oxide, and the like. In this embodiment, the insulating pattern 154 may act as a negative fixed charge layer.

The image sensor 100 may further include a plurality of photoelectric conversion regions 125 respectively disposed in the plurality of pixel regions P1 to P4. The photoelectric conversion region 125 may convert an optical signal into an electric signal. The photoelectric conversion region 125 may include a photodiode region formed in the substrate 110. The photoelectric conversion region 125 may include an impurity region doped with impurities of a conductivity type opposite to that of the substrate 110.

The image sensor 100 may further include a plurality of shallow trenches, such as first to fourth shallow trenches ST1 to ST4. Each of the shallow trenches, such as the first to fourth shallow trenches ST1 to ST4 may extend into the substrate 110 from the first surface Sa of the substrate 110. For example, each of the first to fourth shallow trenches ST1 to ST4 partially penetrates the substrate 110 and may not completely penetrate the substrate 110. For example, the depth in the thickness direction (e.g., the Z direction) of each of the first to fourth shallow trenches ST1 to ST4 may be less than the depth in the thickness direction (e.g., the Z direction) of the deep trench DT.

The image sensor 100 may further include a plurality of patterns, such as first to fourth patterns P1a to P4a, respectively defined by the plurality of shallow trenches, such as the first to fourth shallow trenches ST1 to ST4. However, embodiments of the present inventive concepts are not limited thereto and the number of the plurality of patterns defined by the shallow trenches and the number of shallow trenches may vary. The plurality of shallow trenches, such as the first to fourth shallow trenches ST1 to ST4 may at least partially form a device isolation layer. The plurality of patterns, such as the first to fourth patterns P1a to P4a may be electrically grounded. In a plan view, the area (e.g., in a plane defined in the X and Y directions) of each of the first to fourth patterns P1a to P4a may be less than about quarter (e.g., about 25%) of the area of each of the first to fourth pixel regions P1 to P4.

As shown in the embodiment of FIG. 1B, the first pattern P1a defined by the first shallow trench ST1 in the first pixel region P1 may include a first corner C1a, a second corner C1b separated from e first corner C1a in the X direction, a third corner C1c separated from the first corner C1a in the Y direction, and a fourth corner C1d separated from the second corner C1b in the Y direction and separated from the third corner C1c in the X direction. The first corner C1a may face the fourth corner C1d in a first diagonal direction (e.g., between the X and Y directions) and the second corner C1b may face the third corner C1c in a second diagonal direction that crosses (e.g., is perpendicular) to the first diagonal direction. In an embodiment, the first pattern Pia may have a square shape in a plan view, such as a rounded square shape as shown in the embodiment of FIGS. 1A-1B. However, embodiments of the present inventive concepts are not limited thereto and the shape of the first to fourth patterns P1a-P1d in a plan view may vary.

In a plan view, the radius of curvature R1b of the second corner C1b of the first pattern P1a may be less than the radius of curvature R1a of the first corner C1a of the first pattern P1a. In addition, the radius of curvature R1b of the second corner C1b of the first pattern P1a may be less than the radius of curvature R1d of the fourth corner C1d of the first pattern P1a. In addition, the radius of curvature R1c of the third corner C1c of the first pattern P1a may be less than the radius of curvature R1a of the first corner C1a of the first pattern P1a. In addition, the radius of curvature R1c of the third corner C1c of the first pattern P1a may be less than the radius of curvature R1d of the fourth corner C1d of the first pattern P1a. In an embodiment, the curvatures of the second corner C1b and the third corner C1c of the first pattern P1a may be relatively sharp. In an embodiment, the radiuses of curvature of the second corner C1b and the third corner C1c of the first pattern P1a may be substantially equal to each other.

As shown in the embodiment of FIG. 1B, in a plan view, the first edge E1 extending between the second corner C1b and the fourth corner C1d of the first pattern P1a may be substantially parallel to an edge of the deep trench DT. In a plan view, the second edge E2 extending between the third corner C1c and the fourth corner C1d of the first pattern P1a may be substantially parallel to an edge of the deep trench DT.

As shown in the embodiment of FIG. 1B, the second pattern P2a defined by the second shallow trench ST2 in the second pixel region P2 may include a first corner C2a, a second corner C2b separated from the first corner C2a in the X direction, a third corner C2c separated from the first corner C2a. In the Y direction, and a fourth corner C2d separated from the second corner C2b in the Y direction and separated from the third corner C2c in the X direction. In an embodiment, the shape of the second pattern P2a in a plan view may be a square, for example, a rounded square as shown in the embodiment of FIG. 1B. However, embodiments of the present inventive concepts are not limited thereto.

In a plan view, the radius of curvature R2a of the first corner C2a of the second pattern P2a may be less than the radius of curvature R2b of the second corner C2b of the second pattern P2a. Also, the radius of curvature R2a of the first corner C2a of the second pattern P2a may be less than the radius of curvature R2c of the third corner C2c of the second pattern P2a. Also, the radius of curvature R2d of the fourth corner C2d of the second pattern P2a may be less than the radius of curvature R2b of the second corner C2b of the second pattern P2a. In addition, the radius of curvature R2d of the fourth corner C2d of the second pattern P2a may be less than the radius of curvature R2c of the third corner C2c of the second pattern P2a. In an embodiment, the curvatures of the first corner C2a and the fourth corner C2d of the second pattern P2a may be relatively sharp. In an embodiment the radiuses of curvature of the first corner C2a and the fourth corner C2d of the second pattern P2a may be substantially equal to each other.

As shown in the embodiment of FIG. 1B, the third pattern P1a defined by the third shallow trench ST3 in the third pixel region P3 may include a first corner C3a, a second corner C3b separated from the first corner C3a in the X direction, a third corner C3c separated from the first corner C3a in the Y direction, and a fourth corner C3d separated from the second corner C3b in the Y direction and may be separated from the third corner C3c in the X direction. In an embodiment, the shape of the third pattern P3a in a plan view may be a square, for example, a rounded square as shown in the embodiment of FIG. 1B. However, embodiments of the present inventive concepts are not limited thereto.

In a plan view, the radius of curvature R3a of the first corner C3a of the third pattern P3a may be less than the radius of curvature R3b of the second corner C3b of the third pattern P3a. In addition, the radius of curvature R3a of the first corner C3a of the third pattern P3a may be less than the radius of curvature R3c of the third corner C3c of the third pattern P3a. Also, the radius of curvature R3d of the fourth corner C3d of the third pattern P3a may be less than the radius of curvature R3b of the second corner C3b of the third pattern P3a. In addition, the radius of curvature R3d of the fourth corner C3d of the third pattern P3a may be less than the radius of curvature R3c of the third corner C3c of the third pattern P3a. In an embodiment, the curvatures of the first corner C3a and the fourth corner C3d of the third pattern P3a may be relatively sharp. In an embodiment the radiuses of curvature of the first corner C3a and the fourth corner C3d of the third pattern P3a may be substantially equal to each other.

The fourth pattern P4a defined by the fourth shallow trench ST4 in the fourth pixel region P4 may include a first corner C4a, a second corner C4b separated from the first corner C4a in the X direction, a third corner C4c separated from the first corner C4a in the Y direction, and a fourth corner C4d separated from the second corner C4b in the Y direction and separated from the third corner C4c in the X direction. In an embodiment, the shape of the fourth pattern P4a in a plan view may be a square, for example, a rounded square as shown in the embodiment of FIG. 1B. However, embodiments of the present inventive concepts are not limited thereto.

In a plan view, the radius of curvature R4b of the second corner C4b of the fourth pattern P4a may be less than the radius of curvature R4a of the first corner C4a of the fourth pattern P4a. In addition, the radius of curvature R4b of the second corner C4b of the fourth pattern P4a may be less than the radius of curvature R4d of the fourth corner C4d of the fourth pattern P4a. In addition, the radius of curvature R4c of the third corner C4c of the fourth pattern P4a may be less than the radius of curvature R4a of the first corner C4a of the fourth pattern P4a. In addition, the radius of curvature R4c of the third corner C4c of the fourth pattern P4a may be less than the radius of curvature R4d of the fourth corner C4d of the fourth pattern P4a. In an embodiment, the curvatures of the second corner C4b and the third corner C4c of the fourth pattern P4a may be relatively sharp, in an embodiment the radiuses of curvature of the second corner C4b and the third corner C4c of the fourth pattern P4a may be substantially equal to each other.

In an embodiment, the shapes of the first pattern P1a and the third pattern P3a in a plan view may be symmetrical to each other with respect to the first center line CL1 passing between the first pattern P1a and the third pattern P3a in the X direction. In an embodiment, the shapes of the second pattern P2a and the fourth pattern P4a in a plan view may be symmetrical to each other with respect to the first center line CL1 passing between the second pattern P2a and the fourth pattern P4a in the X direction. In an embodiment, the shapes of the first pattern P1a and the second pattern P2a in a plan view may be symmetrical to each other with respect to the second center line CL2 passing between the first pattern P1a and the second pattern P2a in the Y direction, in an embodiment, the shapes of the third pattern P3a and the fourth pattern P4a in a plan view may be symmetrical to each other with respect to the second center line CL2 passing between the third pattern P3a and the fourth pattern P4a in the Y direction.

In an embodiment, the image sensor 100 may further include a plurality of additional patterns, such as first to fourth additional patterns P1b to P4b, respectively defined by a plurality of shallow trenches, such as the first to fourth shallow trenches ST1 to ST4. However, embodiments of the present inventive concepts are not limited thereto and the number of the additional patterns and the shallow trenches may vary. In a plan view, an area of each of the first to fourth additional patterns P1b to P4b (e.g., area in a plane defined in the X and Y directions) may be greater than an area of each of the first to fourth patterns P1a to P4a. In a plan view, the shortest distance D1 between the first pattern P1a and the deep trench DT may be less than the shortest distance D2 between the first pattern P1a and the first additional pattern P1b. In a plan view, the shortest distance D1 between the first pattern P1a and the deep trench DT may be less than the shortest distance D3 between the first additional pattern P1b and the deep trench DT.

In an embodiment, the shapes of the first additional pattern P1b and the third additional pattern P3b in a plan view may be symmetrical with respect to the first pattern first center line CL1. In an embodiment, the shapes of the second additional pattern P2b and the fourth additional pattern P4b in a plan view may be symmetrical with respect to the first center line CL1. In an embodiment, the shapes of the first additional pattern P1b and the second additional pattern P2b in a plan view may be symmetrical with respect to the second center line CL2. In an embodiment, the shapes of the third additional pattern P3b and the fourth additional pattern P4b in a plan view may be symmetrical with respect to the second center line CL2.

As shown in the embodiment of FIG. 1C, the image sensor 100 may further include an element separation film 120 disposed in the plurality of shallow trenches ST1 to ST4. The element separation film 120 may define the plurality of patterns, such as the first to fourth patterns P1a to P4a, and the plurality of additional patterns, such as the first to fourth additional patterns P1b to P4b. The upper surface of the element separation film 120 may be coplanar (e.g., in the Z direction) with the first surface Sa of the substrate 110, in an embodiment, the element separation film 120 may include silicon oxide, silicon nitride, or a combination thereof. However, embodiments of the present inventive concepts are not limited thereto.

The image sensor 100 may further include a plurality of gates disposed on the plurality of additional patterns, such as the first to fourth additional patterns P1b to P4b. The plurality of gates, such as a transfer gate TG, a drive gate SF, a selection gate SG, and a reset gate RG. However, embodiments of the present inventive concepts are not limited thereto. The image sensor 100 may further include a plurality of floating diffusion regions FD respectively adjacent to the transfer gates TG in each of the plurality of additional patterns, such as the first to fourth additional patterns P1b to P4b. The floating diffusion region FD may have a conductivity type opposite to that of the substrate 110. The first to fourth additional patterns P1b to P4b, the plurality of gates, such as the transfer gate TG, the drive gate SF, the selection gate SG, and the reset gate RG, and the floating diffusion region FD may form a transfer transistor, a drive transistor, a selection transistor, and a reset transistor. The plurality of patterns, such as the first to fourth patterns P1a to P4a, may serve as a ground pattern for grounding at least one body of a transfer transistor, a drive transistor, a selection transistor, and a reset transistor.

A front structure 130 may be disposed on the first surface Sa of the substrate 110. As shown in the embodiment of FIG. 1C, the front structure 130 may include a plurality of contacts 134a, a plurality of wiring layers, such as first and second wiring layers 134b and 134c, and a plurality of insulating layers, such as first to third insulating layers 136a, 136b, and 136c. The plurality of insulating layers, such as the first to third insulating layers 136a, 136b, and 136c may electrically separate the plurality of contacts 134a and the plurality of wiring layers, such as the first and second wiring layers 134b and 134c.

The plurality of contacts 134a and the plurality of wiring layers, such as first and second wiring layers 134b and 134c, may be electrically connected to transistors on the first surface Sa of the substrate 110. In an embodiment, the plurality of wiring layers, such as the first and second wiring layers 134b and 134c, and the plurality of contacts 134a may include at least one compound selected from tungsten, aluminum, copper, tungsten silicide, titanium silicide, tungsten nitride, titanium nitride, doped polysilicon, and the like. In an embodiment, the plurality of insulating layers, such as the first to third insulating layers 136a, 136b, and 136c, may include an insulating material such as silicon oxide, silicon nitride, silicon oxynitride, and a low-k material. The low-k material may include, for example, at least one compound selected from Flowable Oxide (FOX), Torene SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material, and a combination thereof. However, embodiments of the present inventive concepts are not limited thereto.

The image sensor 100 may further include a support substrate 140 on the front structure 130. An adhesive member may be further disposed between the support substrate 140 and the front structure 130 to secure the support substrate 140 to the front structure 130. However, embodiments of the present inventive concepts are not limited thereto and the image sensor 100 may not include a support substrate 140 in some embodiments.

A rear anti-reflection layer 161 may be disposed on the second surface Sb of the substrate 110. In an embodiment, the rear anti-reflection layer 161 may include at least one compound selected from hafnium oxide ($HfO_2$), silicon oxide ($SiO_2$), silicon nitride (SiN), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), and combinations thereof.

A fence 163 may be disposed on the rear anti-reflection layer 161. The fence 163 may extend along the pixel separation structure 150 in a plan view. The fence 163 may include a low refractive index material. For example, a low refractive index material may have a refractive index in a range of about 1.0 to about 1.4. In an embodiment, the low refractive index material may include at least one compound selected from polymethylmetacrylate (PMMA), silicon acrylate, cellulose acetate butyrate (CAB), silica, and fluoro-silicon acrylate (FSA). For example, the low refractive index material may include a polymer material in which silica ($SiOx$) particles are dispersed. However, embodiments of the present inventive concepts are not limited thereto.

In embodiments in which the fence 163 includes a low refractive index material having a relatively low refractive index, light incident toward the fence 163 is totally reflected and is directed toward the center of each of the plurality of pixel regions, such as the first to fourth pixel regions P1 to P4. The fence 163 may prevent light incident obliquely into a color filter 170 disposed on one of the plurality of pixel regions P1 to P4 from entering the color filter 170 disposed on another adjacent pixel region. Therefore, the fence 163 may prevent crosstalk between the first to fourth pixel regions P1 to P4.

The plurality of color filters 170 may be disposed on the rear anti-reflection layer 161 (e.g., directly thereon in the Z direction) and may be separated from each other (e.g., in the X direction) by the fence 163. In an embodiment, the plurality of color filters 170 may be, for example, a combination of a green filter, a blue filter, and a red filter. In another embodiment, the plurality of color filters 170 may be a combination of cyan, magenta, and yellow, for example. However, embodiments of the present inventive concepts are not limited thereto and the colors of the plurality of color filters 170 may vary.

A microlens 180 may be disposed on the color filter 170 and the fence 163 (e.g., disposed directly thereon in the Z direction). In a plan view, the microlens 180 may include a plurality of microlenses that are disposed to correspond to the plurality of pixel regions, such as the first to fourth pixel regions P1 to P4, respectively. The microlens 180 may be transparent. In an embodiment, the microlens 180 may be formed of, for example, a resin-based material such as a styrene-based resin, an acrylic resin, a styrene-acrylic copolymer resin, or a siloxane-based resin. The microlens 180 may collect incident light, and the collected light may be incident on the photoelectric conversion region 125 through the color filter 170. A capping layer 190 may be disposed on the microlens 180 to protect the microlens 180. For example, the capping layer 190 may be disposed directly on the microlens 180 (e.g., in the Z direction).

Figure 2A:
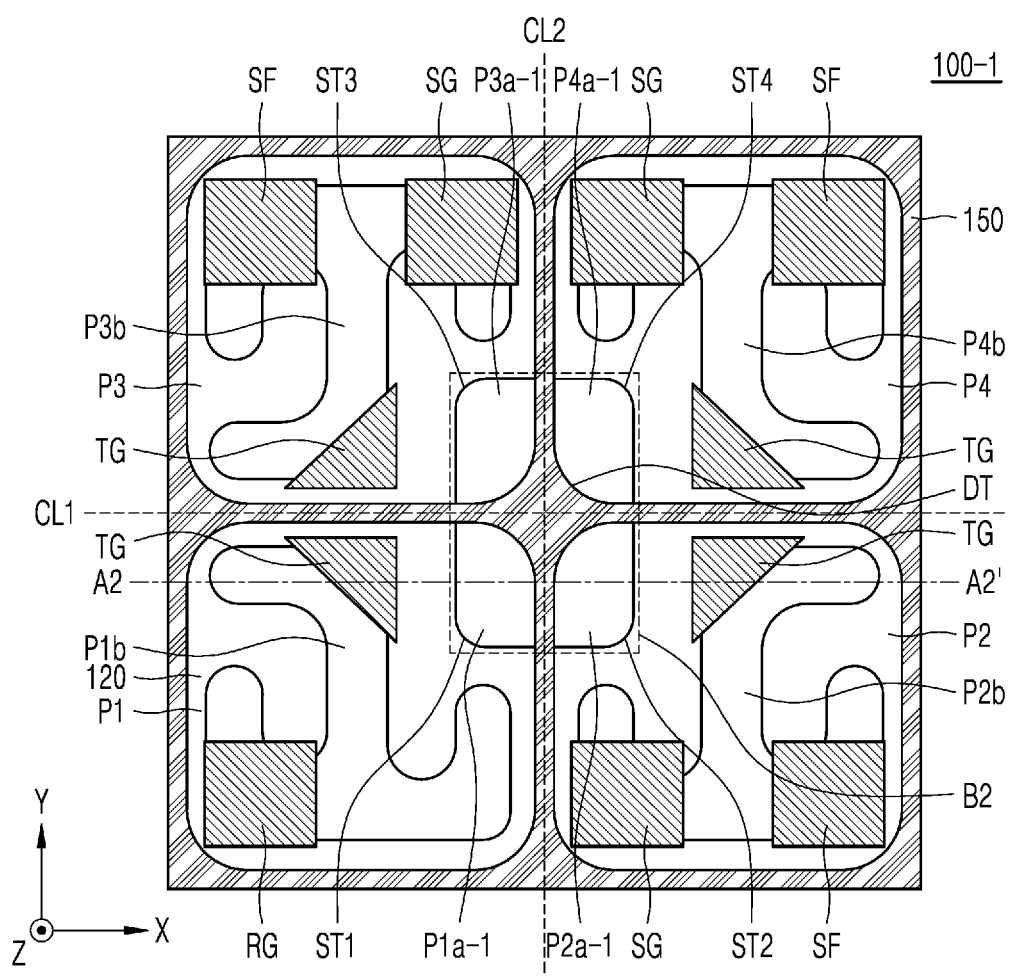
FIG. 2A is a plan view of an image sensor according to an embodiment of the present inventive concepts.
Figure 2B:
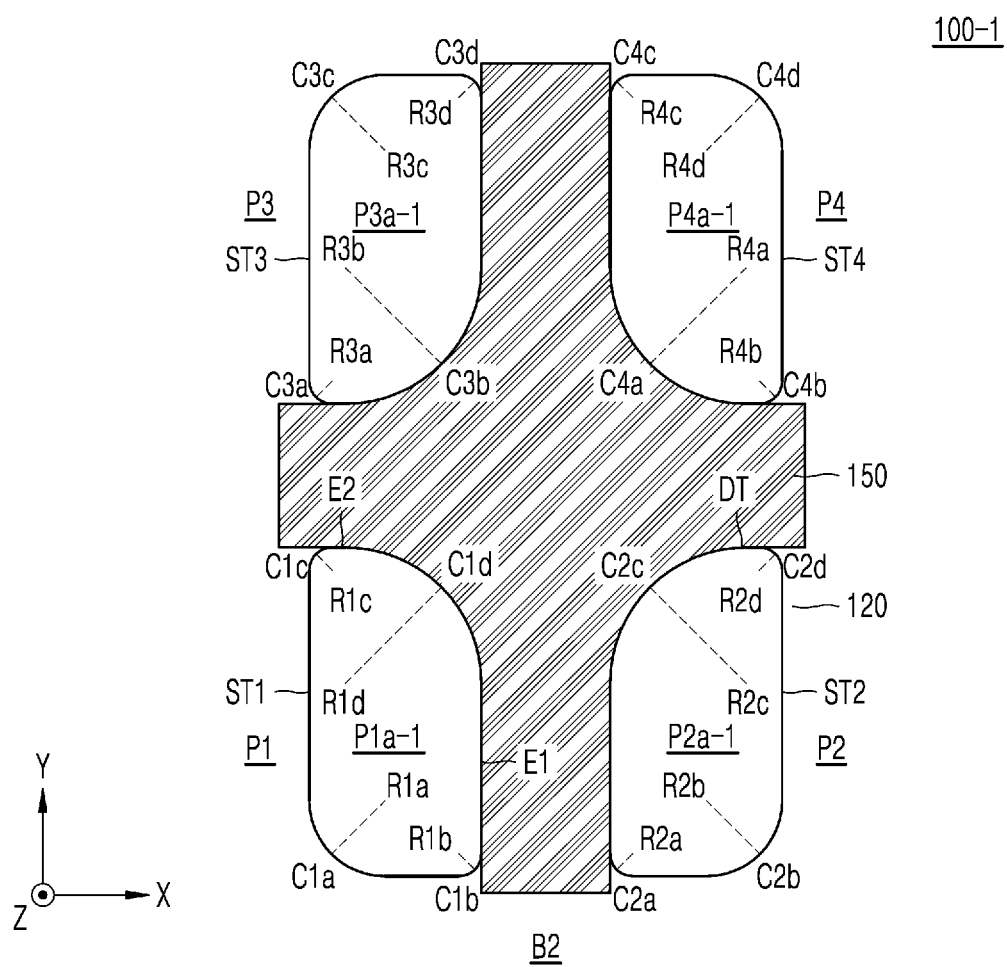
FIG. 2B is an enlarged view of an area B2 of FIG. 2A according to an embodiment of the present inventive concepts.
Figure 2C:
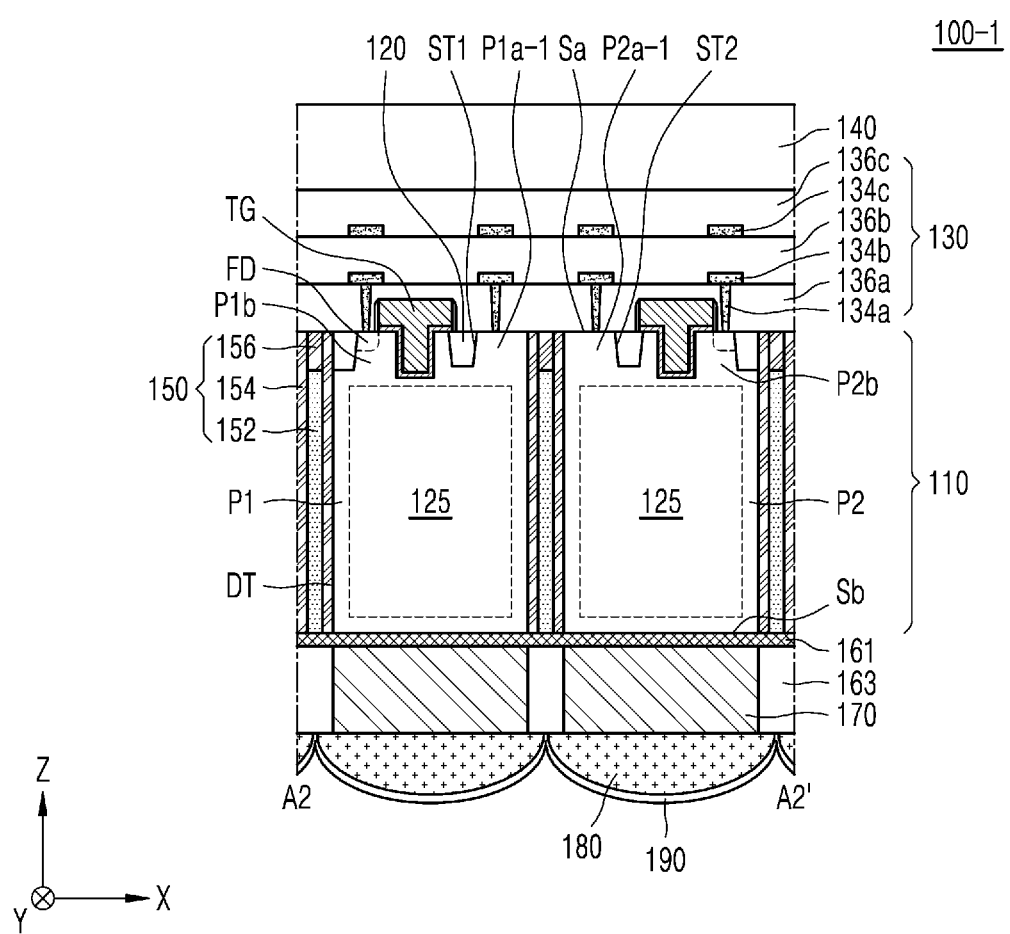
FIG. 2C is a cross-sectional view taken along a line A2-A2' of FIG. 2A according to an embodiment of the present inventive concepts.

FIG. 2A is a plan view of an image sensor 100-1 according to an embodiment of the present inventive concepts. FIG. 2B is an enlarged view of an area B2 of FIG. 2A. FIG. 2C is a cross-sectional view taken along a line A2-A2' of FIG. 2A. Hereinafter, differences between the image sensor 100 illustrated in the embodiments of FIGS. 1A to 1C and the image sensor 100-1 illustrated in FIGS. 2A to 2C will be described and a repeated description of similar or identical elements may be omitted for convenience of explanation.

Referring to the embodiments of FIGS. 2A to 2C, the image sensor 100-1 may include a plurality of patterns, such as first to fourth patterns P1a-1 to P4a-1. The plurality of patterns, such as the first to fourth patterns P1a-1 to P4a-1, may directly contact the pixel separation structure 150. For example, a partial portion of each of the first to fourth patterns P1a-1 to P4a-1 may be defined by the deep trench DT. For example, the first edge E1 that extends between the second corner C1b and the fourth corner C1d of the first pattern P1a-1, and the second edge E2 that extends between the fourth corner C1d and the third corner C1c of the first pattern P1a-1 may be defined by the deep trench DT. For example, the shortest distance D1 between the first pattern P1a and the deep trench DT shown in FIG. 1A may be zero.

Figure 3A:
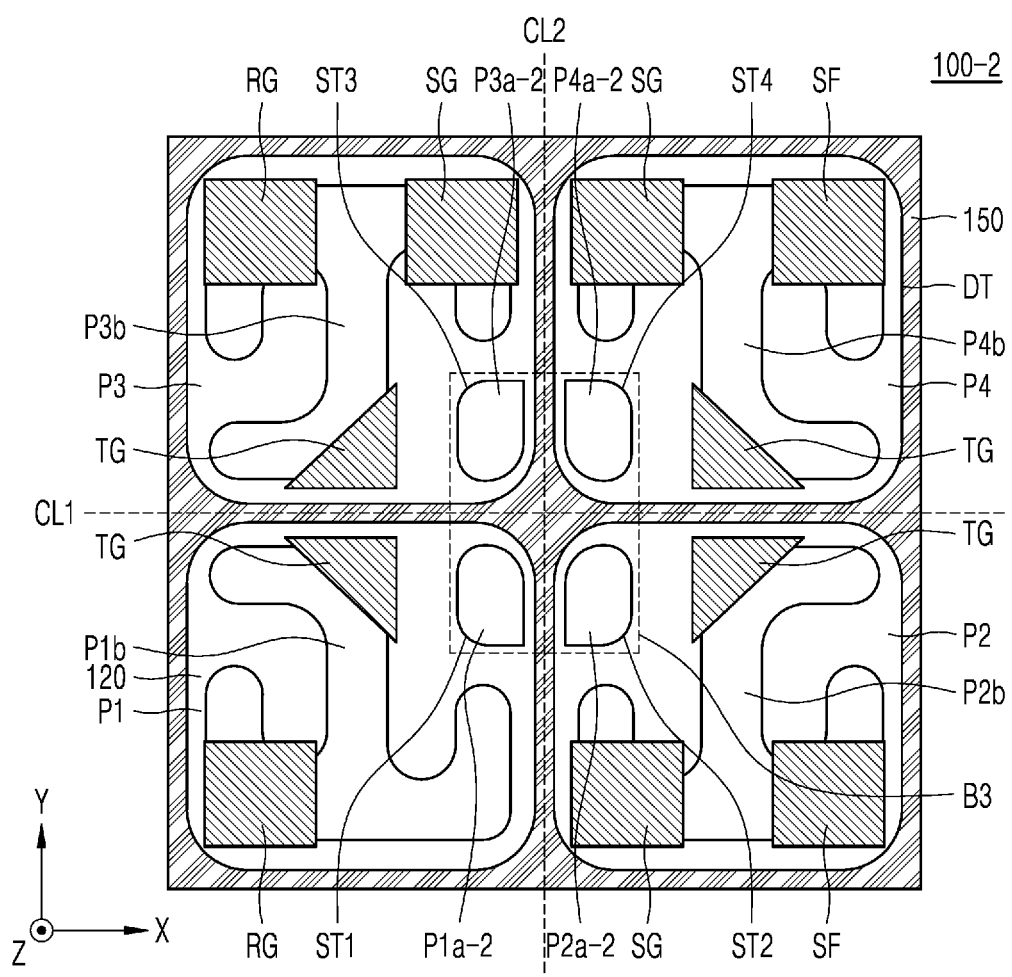
FIG. 3A is a plan view of an image sensor according to an embodiment of the present inventive concepts.
Figure 3B:
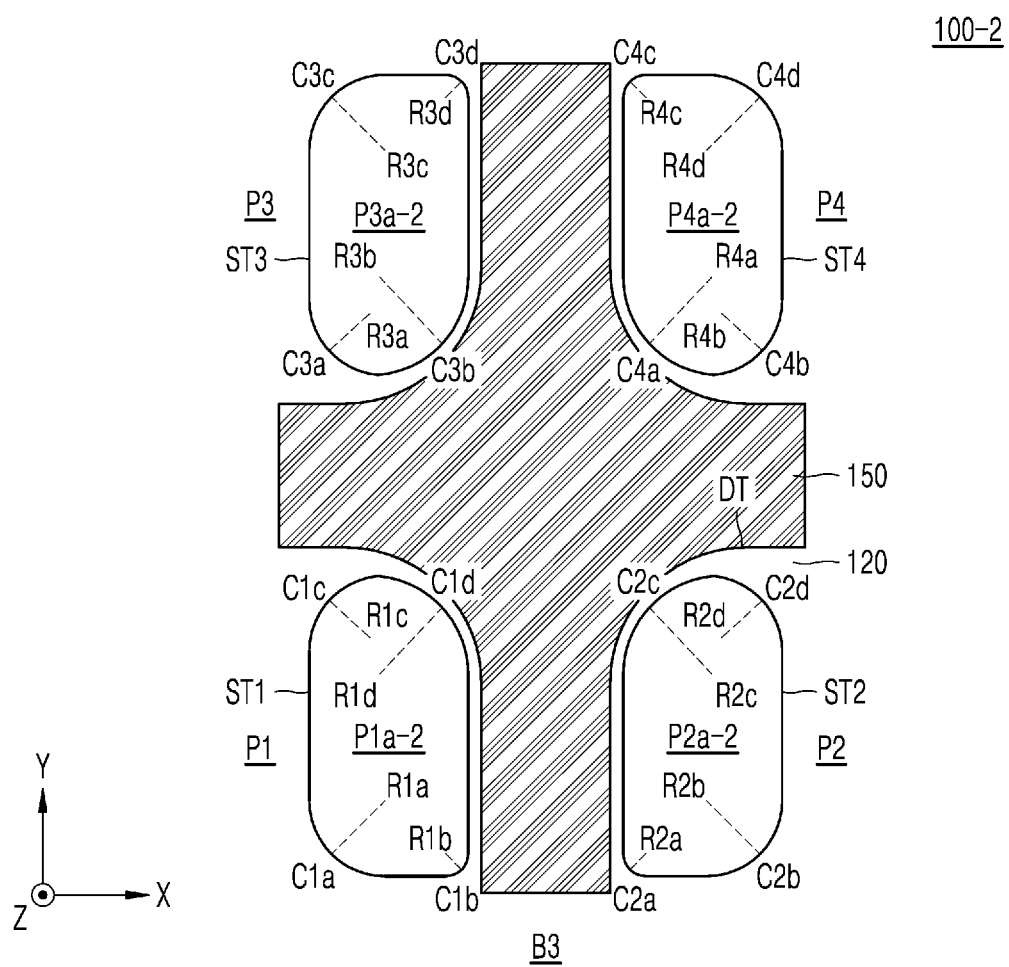
FIG. 3B is an enlarged view of an area B3 of FIG. 3A according to an embodiment of the present inventive concepts.

FIG. 3A is a plan view of an image sensor 100-2 according to an embodiment of the present inventive concepts. FIG. 3B is an enlarged view of an area B3 of FIG. 3A. Hereinafter, differences between the image sensor 100 illustrated in the embodiments of FIGS. 1A to 1C and the image sensor 100-2 illustrated in the embodiments of FIGS. 3A and 3B will be described and a repeated description of similar or identical elements may be omitted for convenience of explanation.

Referring to the embodiments of FIGS. 3A and 3B, the image sensor 100-2 may include a plurality of patterns, such as first to fourth patterns P1a-2 to P4a-2.

The radius of curvature R1b of the second corner C1b of the first pattern P1a-2 may be less than the radius of curvature R1a of the first corner C1a of the first pattern P1a-2. In addition, the radius of curvature R1b of the second corner C1b of the first pattern P1a-2 may be less than the radius of curvature R1c of the third corner C1c of the first patter P1a-2. In addition, the radius of curvature R1b of the second corner C1*b* of the first pattern P1*a*-2 may be less than the radius of curvature R1*d* of the fourth corner C1*d* of the first pattern P1*a*-2. In an embodiment, the curvature of the second corner C1*b* of the first pattern P1*a*-2 may be relatively sharp.

The radius of curvature R2*a* of the first corner C2*a* of the second pattern P2*a*-2 may be less than the radius of curvature R2*b* of the second corner C2*b* of the second pattern P2*a*-2. Also, the radius of curvature R2*a* of the first corner C2*a* of the second pattern P2*a*-2 may be less than the radius of curvature R2*c* of the third corner C2*c* of the second pattern P2*a*-2. In addition, the radius of curvature R2*a* of the first corner C2*a* of the second pattern P2*a*-2 may be less than the radius of curvature R2*d* of the fourth corner C2*d* of the second pattern P2*a*-2. In an embodiment, the curvature of the first corner C2*a* of the second pattern P2*a*-2 may be relatively sharp.

The radius of curvature R3*d* of the fourth corner C3*d* of the third pattern P3*a*-2 may be less than the radius of curvature R3*a* of the first corner C3*a* of the third pattern P3*a*-2. In addition, the radius of curvature R3*d* of the fourth corner C3*d* of the third pattern P3*a*-2 may be less than the radius of curvature R3*b* of the second corner C3*b* of the third pattern P3*a*-2. Also, the radius of curvature R3*d* of the fourth corner C3*d* of the third pattern P3*a*-2 may be less than the radius of curvature R3*c* of the third corner C3*c* of the third pattern P3*a*-2. In an embodiment, the curvature of the fourth corner C3*d* of the third pattern P3*a*-2 may be relatively sharp.

The radius of curvature R4*c* of the third corner C4*c* of the fourth pattern P4*a*-2 may be less than the radius of curvature R4*a* of the first corner C4*a* of the fourth pattern P4*a*-2. Also, the radius of curvature R4*c* of the third corner C4*c* of the fourth pattern P4*a*-2 may be less than the radius of curvature R4*b* of the second corner C4*b* of the fourth pattern P4*a*-2. In addition, the radius of curvature R4*c* of the third corner C4*c* of the fourth pattern P4*a*-2 may be less than the radius of curvature R4*d* of the fourth corner C4*d* of the fourth pattern P4*a*-2. In an embodiment, the curvature of the third corner C4*c* of the fourth pattern P4*a*-2 may be relatively sharp.

Figure 4A:
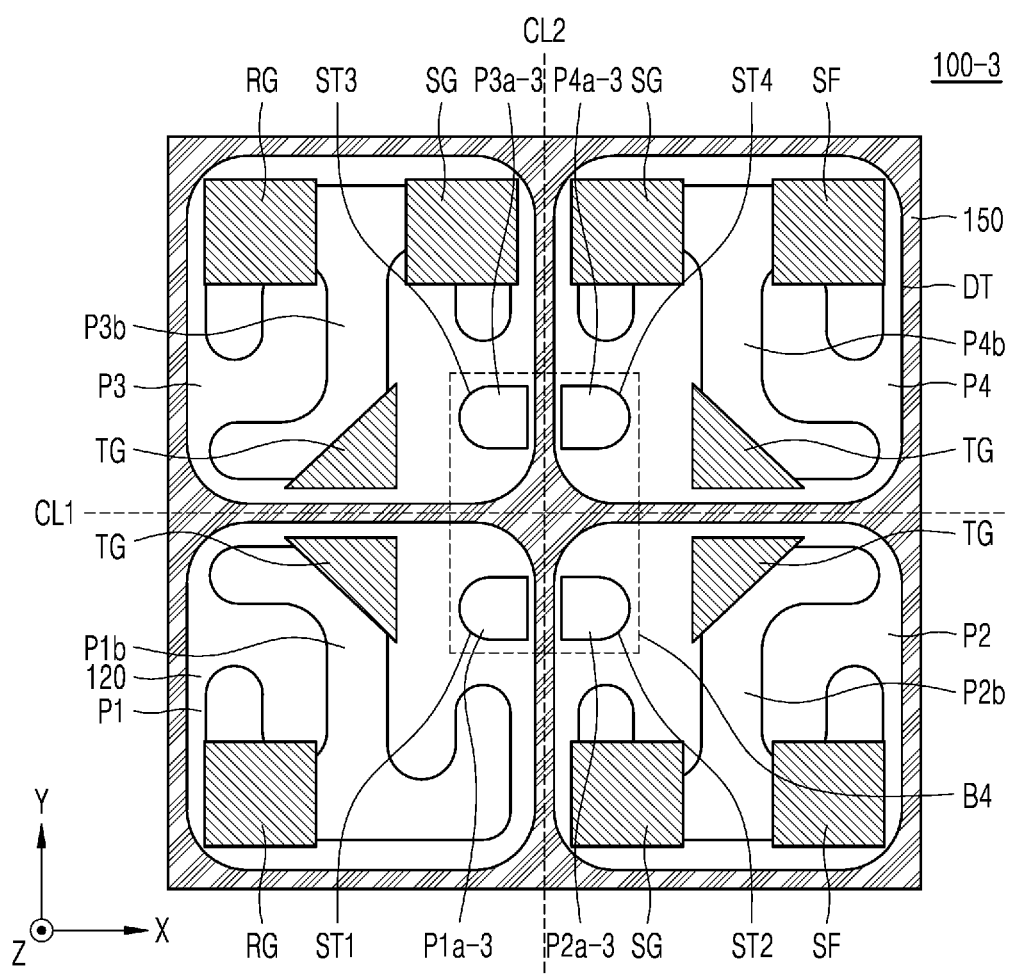
FIG. 4A is a plan view of an image sensor according to an embodiment of the present inventive concepts.
Figure 4B:
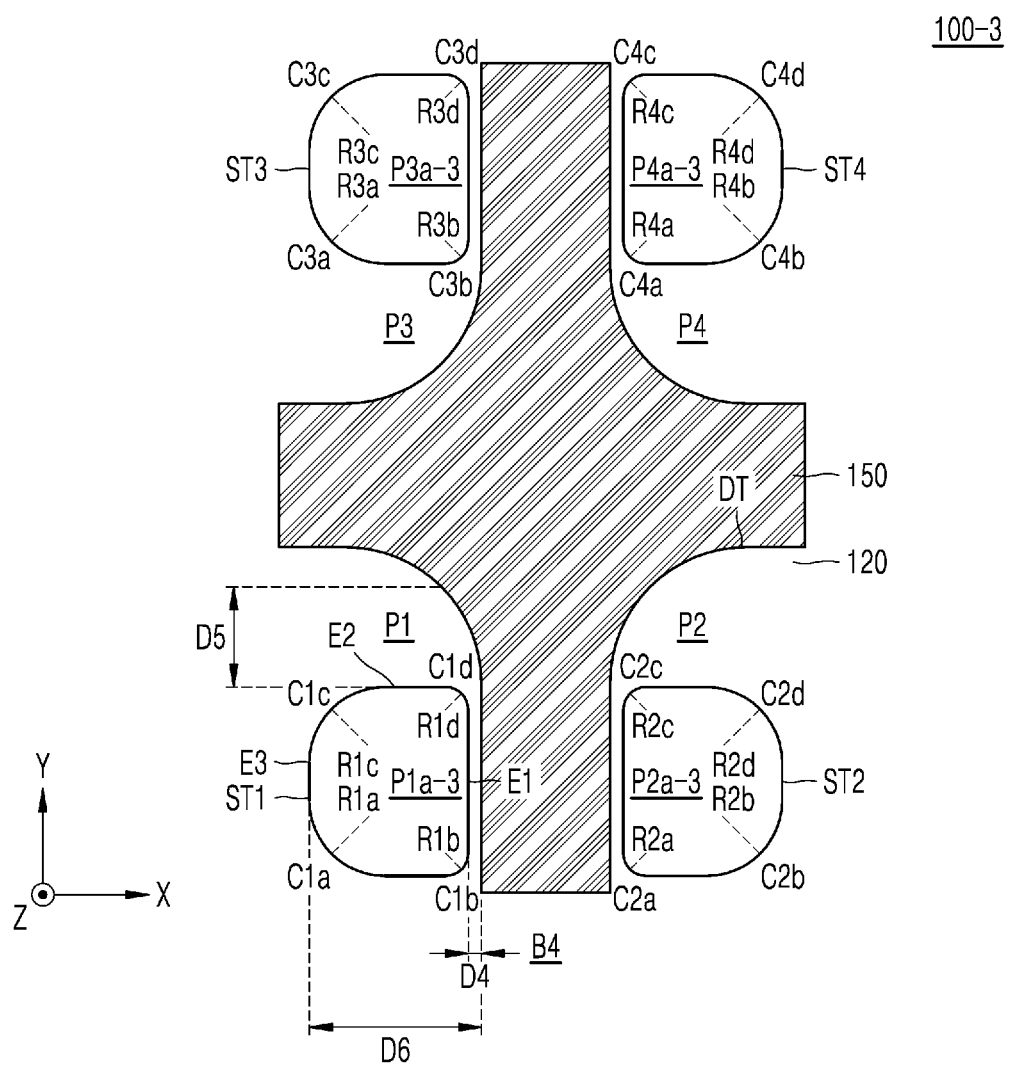
FIG. 4B is an enlarged view of an area B4 of FIG. 4A according to an embodiment of the present inventive concepts.

FIG. 4A is a plan view of an image sensor 100-3 according to an embodiment of the present inventive concepts. FIG. 4B is an enlarged view of an area B4 of FIG. 4A. Hereinafter, differences between the image sensor 100 illustrated in FIGS. 1A to 1C and the image sensor 100-3 illustrated in FIGS. 4A and 4B will be described and a repeated description of similar or identical elements may be omitted for convenience of explanation.

Referring to the embodiments of FIGS. 4A and 4B, the image sensor 100-3 may include a plurality of patterns, such as first to fourth patterns P1*a*-3 to P4*a*-3.

The radius of curvature R1*b* of the second corner C1*b* of the first pattern P1*a*-3 may be less than the radius of curvature R1*a* of the first corner C1*a* of the first pattern P1*a*-3. In addition, the radius of curvature R1*b* of the second corner C1*b* of the first pattern P1*a*-3 may be less than the radius of curvature R1*c* of the third corner C1*e* of the first pattern P1*a*-3. In addition, the radius of curvature R1*d* of the fourth corner C1*d* of the first pattern P1*a*-3 may be less than the radius of curvature R1*a* of the first corner C1*a* of the first pattern P1*a*-3. In addition, the radius of curvature R1*d* of the fourth corner C1*d* of the first pattern P1*a*-3 may be less than the radius of curvature R1*c* of the third corner C1*c* of the first pattern P1*a*-3. In an embodiment, the radiuses of curvature R1*b*, R1*d* of the second aid fourth corners C1*b*, C1*d* of the first pattern P1*a*-3 may be substantially equal to each other.

In an embodiment, the curvatures of the second corner C1*b* and the fourth corner C1*d* of the first pattern P1*a*-3 may be relatively sharp.

The radius of curvature R2*a* of the first corner C2*a* of the second pattern P2*a*-3 may be less than the radius of curvature R2*b* of the second corner C2*b* of the second pattern P2*a*-3. In addition, the radius of curvature R2*a* of the first corner C2*a* of the second pattern P2*a*-3 may be less than the radius of curvature R2*d* of the fourth corner C2*d* of the second pattern P2*a*-3. Also, the radius of curvature R2*c* of the third corner C2*c* of the second pattern P2*a*-3 may be less than the radius of curvature R2*b* of the second corner C2*b* of the second pattern P2*a*-3. In addition, the radius of curvature R2*c* of the third corner C2*c* of the second pattern P2*a*-3 may be less than the radius of curvature R2*d* of the fourth corner C2*d* of the second pattern P2*a*-3. In an embodiment, the radiuses of curvature R2*a*, R2*c* of the first corner C2*a* and the third corner C2*c* of the second pattern P2*a*-3 may be substantially equal to each other. In an embodiment, the curvatures of the first corner C2*a* and the third corner C2*c* of the second pattern P2*a*-3 may be relatively sharp.

The radius of curvature R3*b* of the second corner C3*b* of the third pattern P3*a*-3 may be less than the radius of curvature R1*a* of the first corner C3*a* of the third pattern P3*a*-3. In addition, the radius of curvature R3*b* of the second corner C3*b* of the third pattern P3*a*-3 may be less than the radius of curvature R3*c* of the third corner C3*c* of the third pattern P3*a*-3. Also, the radius of curvature R3*d* of the fourth corner C3*d* of the third pattern P3*a*-3 may be less than the radius of curvature R3*a* of the first corner C3*a* of the third pattern P3*a*-3. In addition, the radius of curvature R3*d* of the fourth corner C3*d* of the third pattern P3*a*-3 may be less than the radius of curvature R3*c* of the third corner C3*c* of the third pattern P3*a*-3. In an embodiment, the radiuses of curvature R3*b*, R3*d* of the second corner C3*b* and the fourth corner C3*d* of the third pattern P3*a*-3 may be substantially equal to each other. In an embodiment, the curvatures of the second corner C3*b* and the fourth corner C3*d* of the third pattern P3*a*-3 may be relatively sharp.

The radius of curvature R4*a* of the first corner C4*a* of the fourth pattern P4*a*-3 may be less than the radius of curvature R4*b* of the second corner C4*b* of the fourth pattern P4*a*-3. In addition, the radius of curvature R4*a* of the first corner C4*a* of the fourth pattern P4*a*-3 may be less than the radius of curvature R4*d* of the fourth corner C4*d* of the fourth pattern P4*a*-3. Also, the radius of curvature R4*c* of the third corner C4*c* of the fourth pattern P4*a*-3 may be less than the radius of curvature R4*b* of the second corner C4*b* of the fourth pattern P4*a*-3. In addition, the radius of curvature R4*c* of the third corner C4*c* of the fourth pattern P4*a*-3 may be less than the radius of curvature R4*d* of the fourth corner C4*d* of the fourth pattern P4*a*-3. In an embodiment, the radiuses of curvature R4*a*, R4*c* of the first corner C4*a* and the third corner C4*c* of the fourth pattern P4*a*-3 may be substantially equal to each other. In an embodiment, the curvatures of the first corner C4*a* and the third corner C4*c* of the fourth pattern P4*a*-3 may be relatively sharp.

In a plan view, the first edge E1 extending between the second corner C1*b* and the fourth corner C1*d* of the first pattern P1*a*-3 may be substantially parallel to an edge of the deep trench DT. In a plan view, the shortest distance D4 in the X direction front the first edge E1 of the first pattern P1*a*-3 to the deep trench DT may be less than the shortest distance D5 in the Y direction from the second edge E2 extending between the third corner C1*c* and the fourth corner C1*d* of the first pattern P1*a*-3 to the deep trench DT.

In a plan view, the shortest distance D4 in the X direction front the first edge E1 of the first pattern P1a-3 to the deep trench DT may be less than the shortest distance D6 in the X direction from the third edge E3 extending between the first corner C1a and the third corner C1c of the first pattern P1a-3 to the deep trench DT.

Figure 5A:
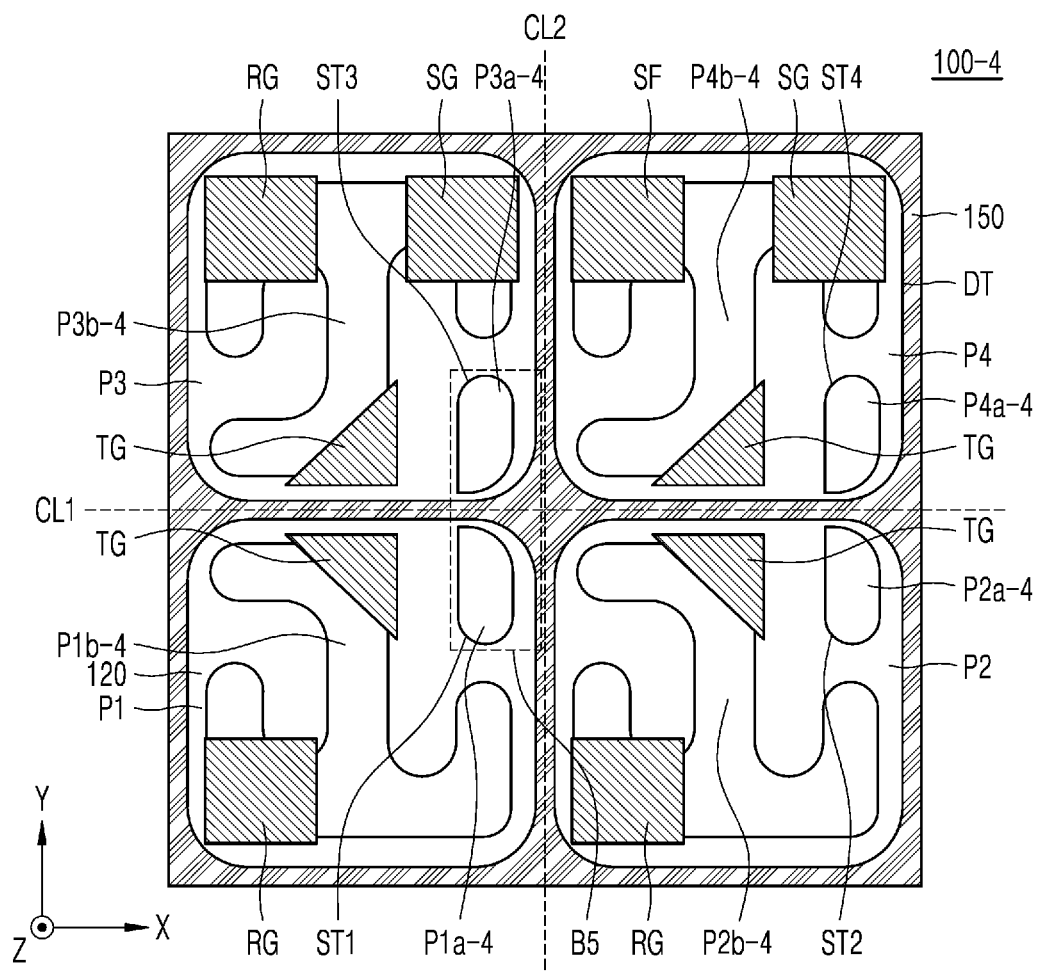
FIG. 5A is a plan view of an image sensor according to an embodiment of the present inventive concepts.
Figure 5B:
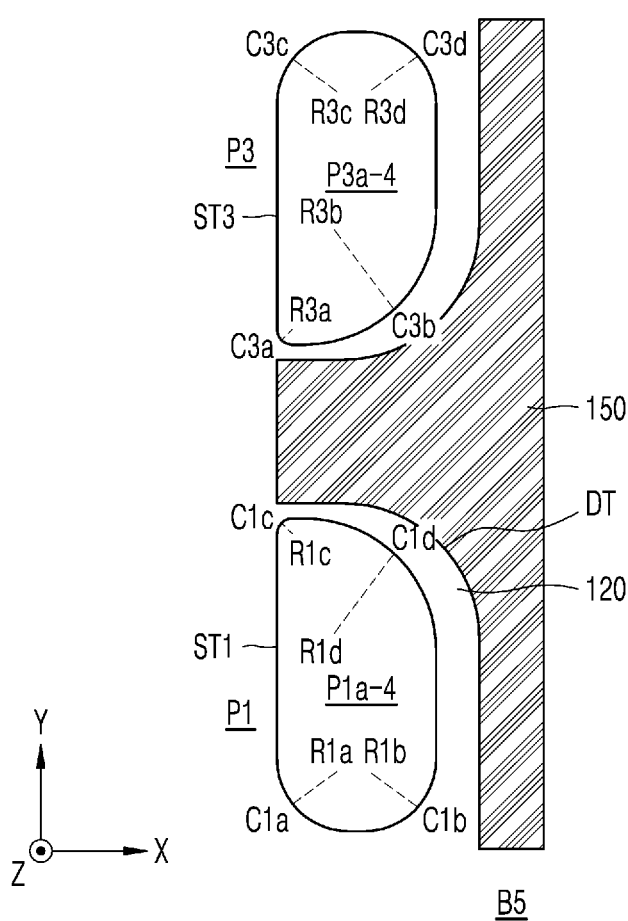
FIG. 5B is an enlarged view of an area B5 of FIG. 5A according to an embodiment of the present inventive concepts.

FIG. 5A is a plan view of an image sensor 100-4 according to an embodiment of the present inventive concepts. FIG. 5B is an enlarged view of an area 135 of FIG. 5A. Hereinafter, differences between the image sensor 100 illustrated in the embodiments of FIGS. IA to 1C and the image sensor 100-4 illustrated in FIGS. 5A and 5B will be described and a repeated description of similar or identical elements may be omitted for convenience of explanation.

The image sensor 100-4 may include a plurality of patterns, such as first to fourth patterns P1a-4 to P4a-4 and a plurality of additional patterns, such as first to fourth additional patterns P1b-4 to P4a-4.

The radius of curvature R1c of the third corner C1e of the first pattern P1a-4 may be less than the radius of curvature R1a of the first corner C1a of the first pattern P1a-4. In addition, the radius of curvature R1c of the third corner C1e of the first pattern P1a-4 may be less than the radius of curvature R1b of the second corner C1b of the first pattern P1a-4. In addition, the radius of curvature R1c of the third corner C1e of the first pattern P1a-4 may be less than the radius of curvature R1d of the fourth corner C1d of the first pattern P1a-4. In an embodiment, the curvature of the third corner C1c of the first pattern P1a-4 may be relatively sharp.

The radius of curvature R3a of the first corner C3a of the third pattern P3a-4 may be less than the radius of curvature R3b of the second corner C3b of the third pattern P1a-4. Also, the radius of curvature R3a of the first corner C3a of the third pattern P3a-4 may be less than the radius of curvature R1c of the third corner C3c of the third pattern P3a-4. Also, the radius of curvature R3a of the first corner C3a of the third pattern P1a-4 may be less than the radius of curvature R3d of the fourth corner C3d of the third pattern P1a-4. In an embodiment, the curvature of the first corner C3a of the third pattern P3a-4 may be relatively sharp.

The shapes of the first pattern P1a-4 and the third pattern P3a-4 in a plan view may be symmetrical with respect to the first center line CL1. However, the first pattern P1a-4 and the second pattern P2a-4 may not be symmetrical with respect to the second center line CL2. Similarly, the third pattern P3a-4 and the fourth pattern P4a-4 may not be symmetrical with respect to the second center line CL2. The second pattern P2a-4 may have a shape in which the first pattern P1a-4 is translated in the X direction. The fourth pattern P4a-4 may have a shape in which the third pattern P1a-4 is translated in the X direction. For example, the shapes of the second pattern P2a-4 and the first pattern P1a-4 in a plan view may be substantially the same. The shape of the fourth pattern P4a-4 and the third pattern P1a-4 in a plan view may be substantially the same.

Similarly, the first additional pattern P1b-4 and the third additional pattern P3b-4 may be symmetrical with respect to the first center line CL1. However, the first additional pattern P1b-4 and the second additional pattern P2b-4 may not be symmetrical with respect to the second center line CL2. Similarly, the third additional pattern P3b-4 and the fourth additional pattern P4b-4 may not be symmetrical with respect to the second center line CL2. The second additional pattern P2b-4 may have a shape in which the first additional pattern P1b-4 is translated in the X direction. The fourth additional pattern P4b-4 may have a shape in which the third additional pattern P3b-4 is translated in the X horizontal direction. For example, the shape of the second additional pattern P2b-4 and the first additional pattern P1b-4 in a plan view may be substantially the same. The shape of the fourth additional pattern P4b-4 and the third additional pattern P3b-4 in a plan view may be substantially the same.

Figure 6A:
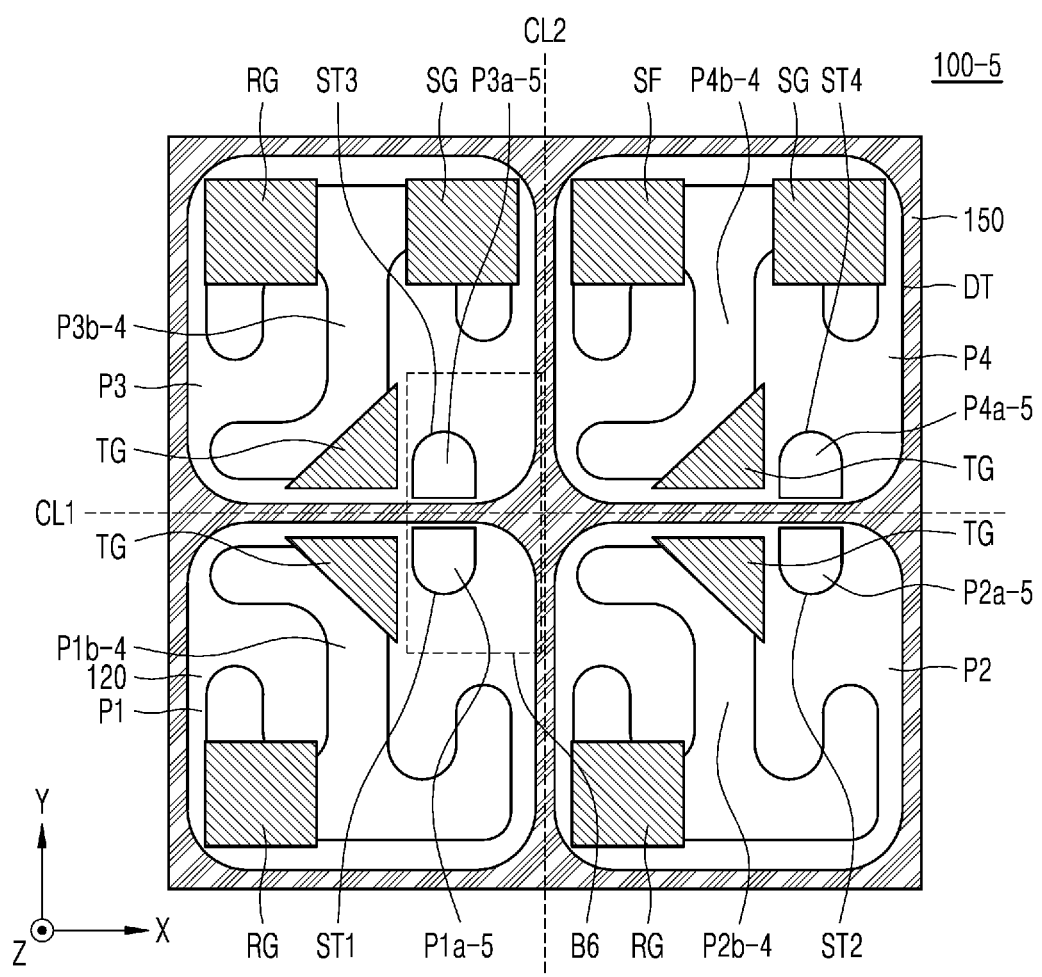
FIG. 6A is a plan view of an image sensor according to an embodiment of the present inventive concepts.
Figure 6B:
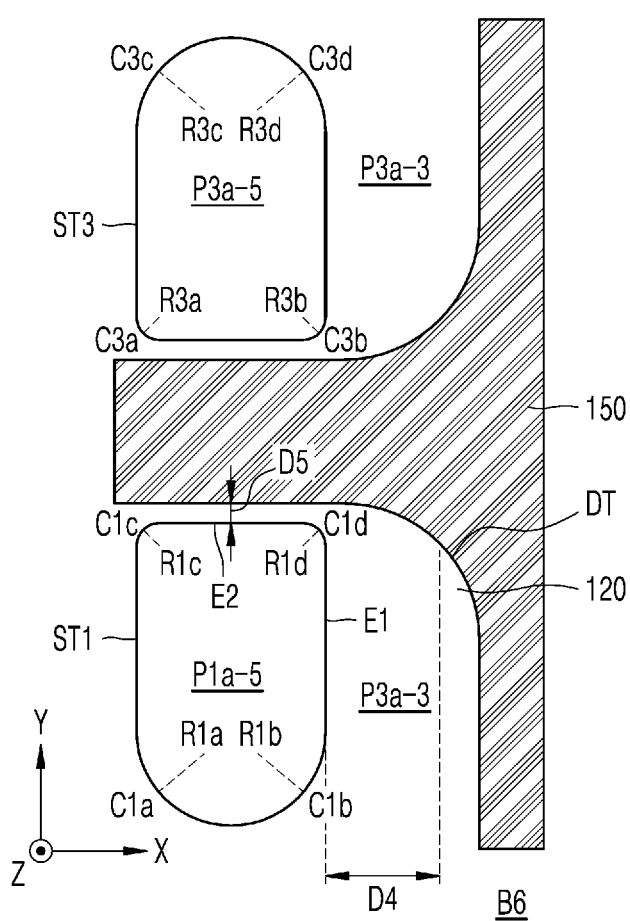
FIG. 6B is an enlarged view of an area B6 of FIG. 6A according to an embodiment of the present inventive concepts.

FIG. 6A is a plan view of an image sensor 100-5 according to an embodiment of the present inventive concepts. FIG. 6B is an enlarged view of an area B6 of FIG. 6A. Hereinafter, differences between the image sensor 100-4 illustrated in the embodiments of FIGS. 5A and 5B and the image sensor 100-5 illustrated in FIGS. 6A and 6B will be described and a repeated description of similar or identical elements may be omitted for convenience of explanation.

Referring to the embodiments of FIGS. 6A and 6B, the image sensor 100-5 may include a plurality of patterns, such as first to fourth patterns P1a-5 to P4a-5.

In a plan view, the radius of curvature R1c of the third corner C1e of the first pattern P1a-5 may be less than the radius of curvature R1a of the first corner C1a of the first pattern P1a-5. In addition, the radius of curvature R1c of the third corner C1e of the first pattern P1a-5 may be less than the radius of curvature R1b of the second corner C1b of the first pattern P1a-5. In addition, the radius of curvature R1d of the fourth corner C1d of the first pattern P1a-5 may be less than the radius of curvature R1a of the first corner C1a of the first pattern P1a-5. In addition, the radius of curvature R1d of the fourth corner C1d of the first pattern P1a-5 may be less than the radius of curvature R1b of the second corner C1b of the first pattern P1a-5, in an embodiment, the radiuses of curvature R1c, R1d of the third corner C1e and the fourth corner C1d of the first pattern P1a-5 may be substantially equal to each other. In an embodiment, the curvatures of the third corner C1c and the fourth corner C1d of the first pattern P1a-5 may be relatively sharp.

In a plan view, the radius of curvature R3a of the first corner C3a of the third pattern P3a-5 may be less than the radius of curvature R3c of the third corner C3c of the third pattern P3a-5. Also, the radius of curvature R3a of the first corner C3a of the third pattern P1a-5 may be less than the radius of curvature R3d of the fourth corner C3d of the third pattern P3a-5. Also, the radius of curvature R3b of the second corner C3b of the third pattern P3a-5 may be less than the radius of curvature R3c of the third corner C3c of the third pattern P3a-5. In addition, the radius of curvature R3b of the second corner C3b of the third pattern P1a-5 may be less than the radius of curvature R3d of the fourth corner C3d of the third pattern P1a-5. In an embodiment, the radiuses of curvature R3a, R3b of the first corner C3a and the second corner C3b of the third pattern P3a-5 may be substantially equal to each other. In an embodiment, the curvatures of the first corner C3a and the second corner C3b of the third pattern P1a-5 may be relatively sharp. As shown in the embodiment of FIG. 6A, the shapes of the second pattern P2a-5 and the first pattern P1a-5 in a plan view may be substantially similar to each other. The shapes of the fourth pattern P4a-5 and the third pattern P1a-5 in a plan view may be substantially similar to each other.

In a plan view, the shortest distance D4 in the X direction from the first edge E1 extending between the second corner C1b and the fourth corner C1d of the first pattern P1a-5 to the deep trench DT may be greater than the shortest distance D5 in the Y direction from the second edge E2 extending between the third corner C1c and the fourth corner C1d of the first pattern P1a-5 to the deep trench DT. In a plan view, the second edge E2 may be parallel to the deep trench DT.

Figure 7A:
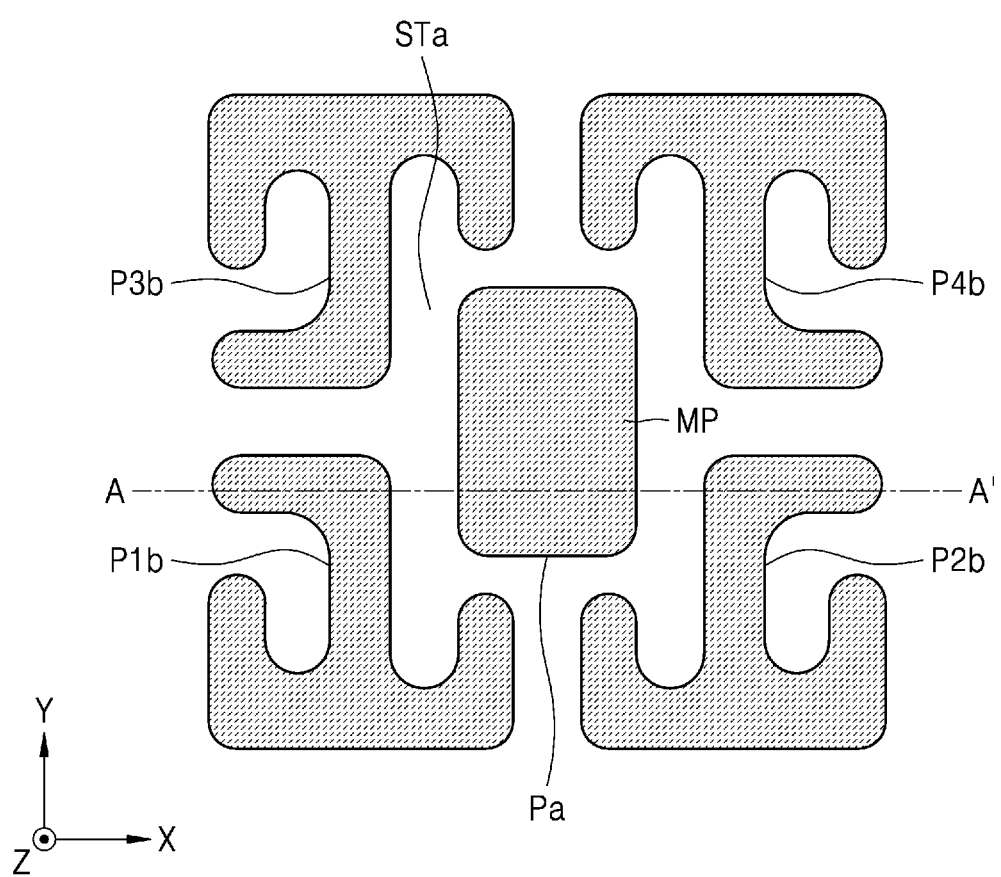
FIGS. 7A to 13 are diagrams for describing a method of manufacturing an image sensor, according to embodiments of the present inventive concepts.
Figure 7B:
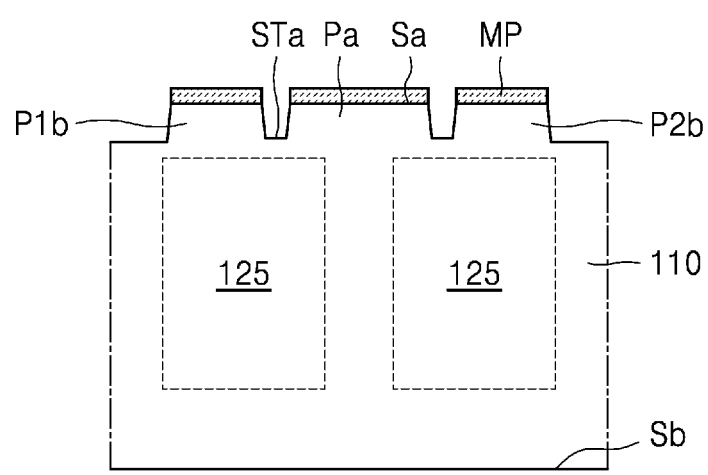
Figure 8A:
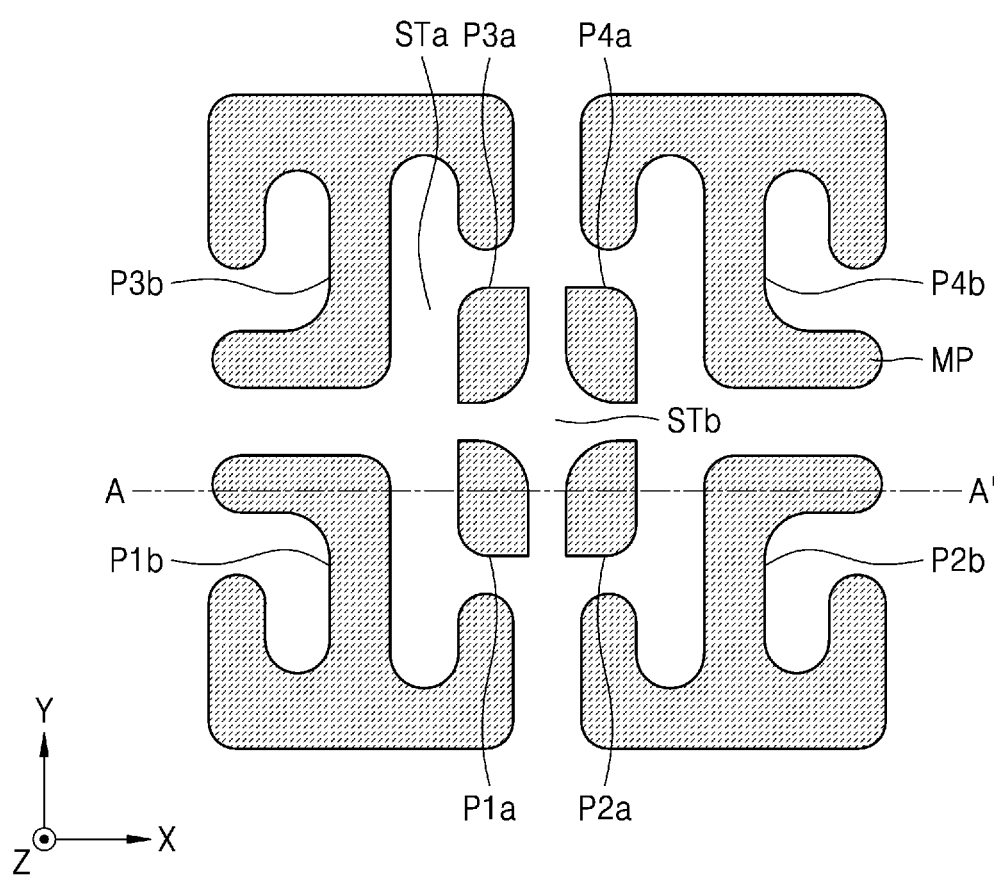
Figure 8B:
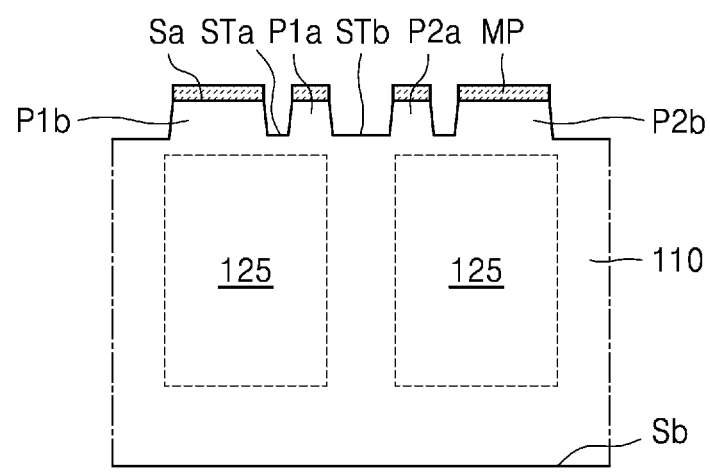
Figure 8B:
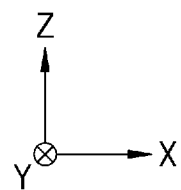
Figure 8C:
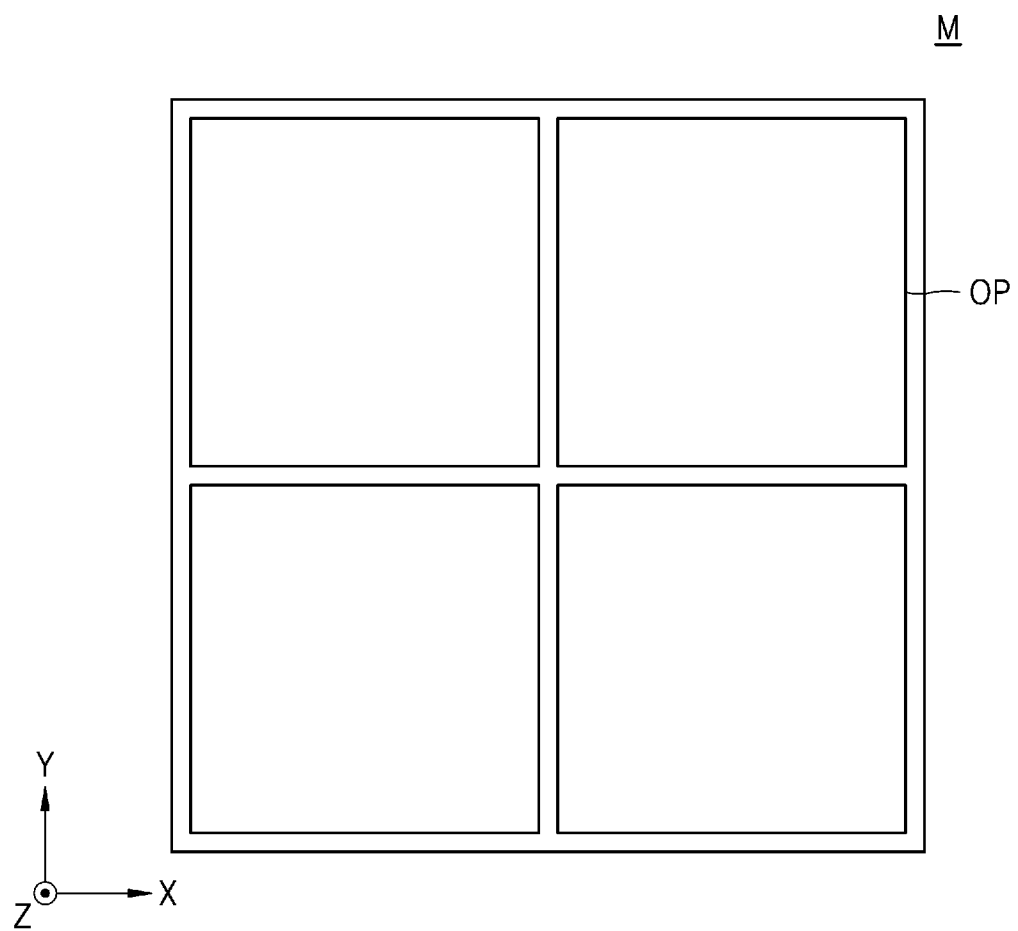
Figure 9:
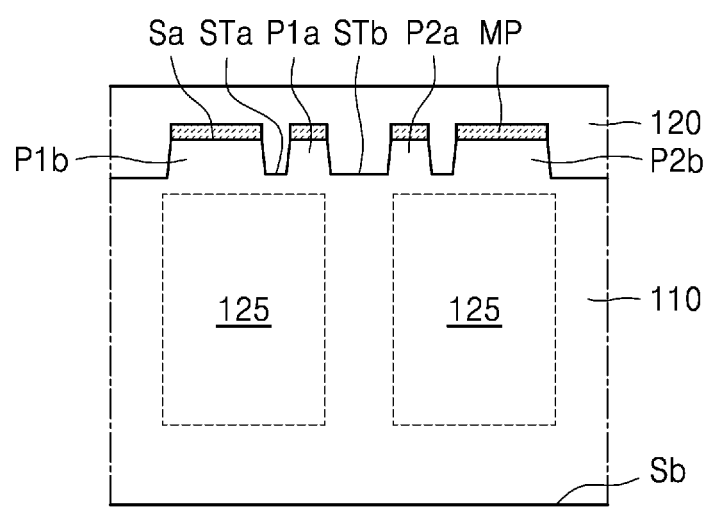
Figure 11A:
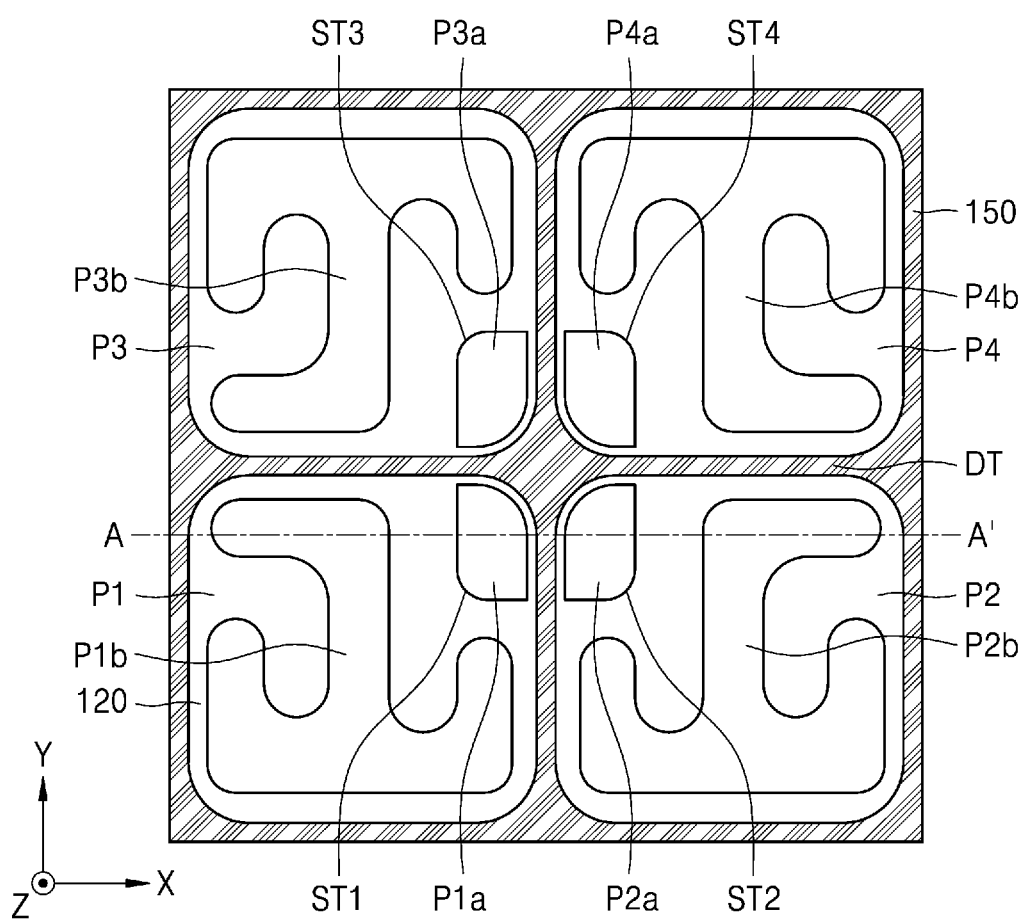
Figure 11B:
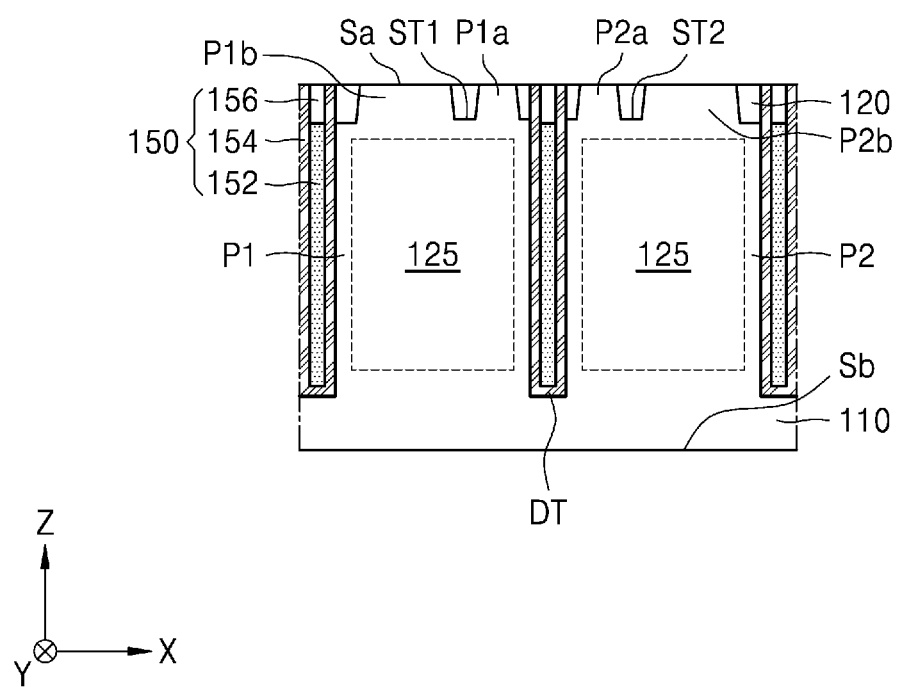
Figure 12A:
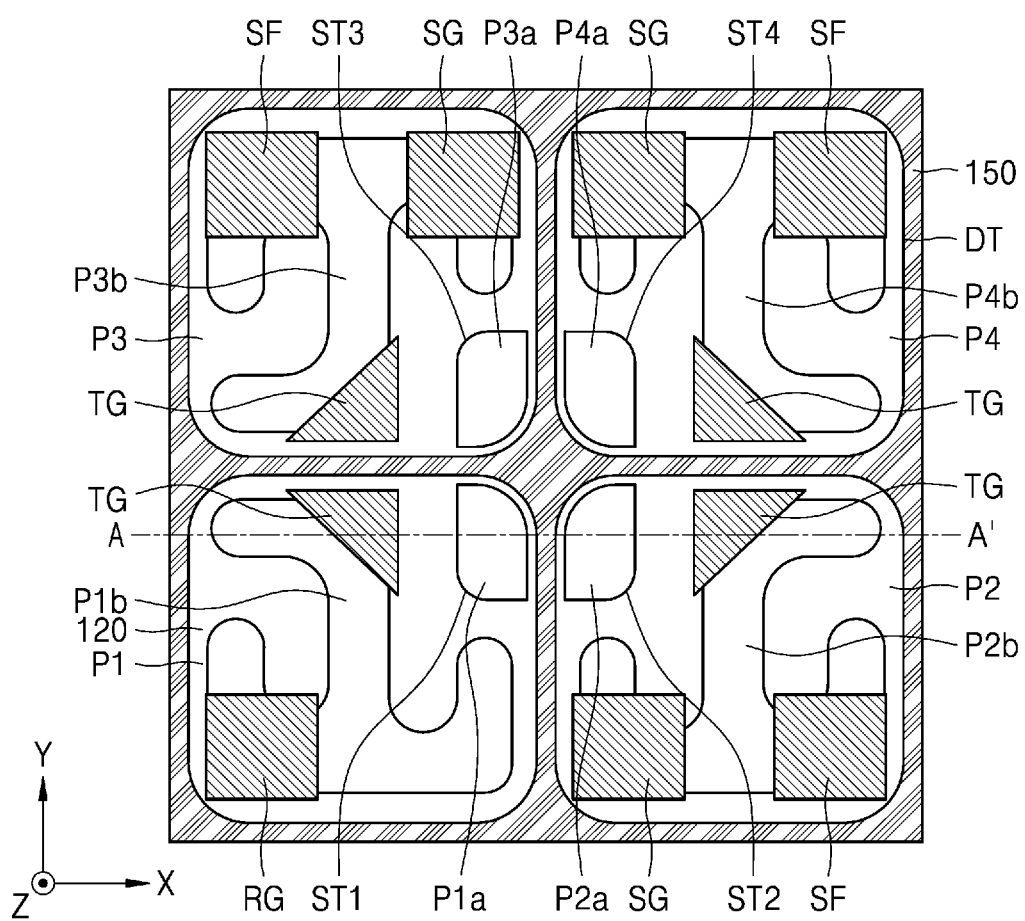
Figure 12B:
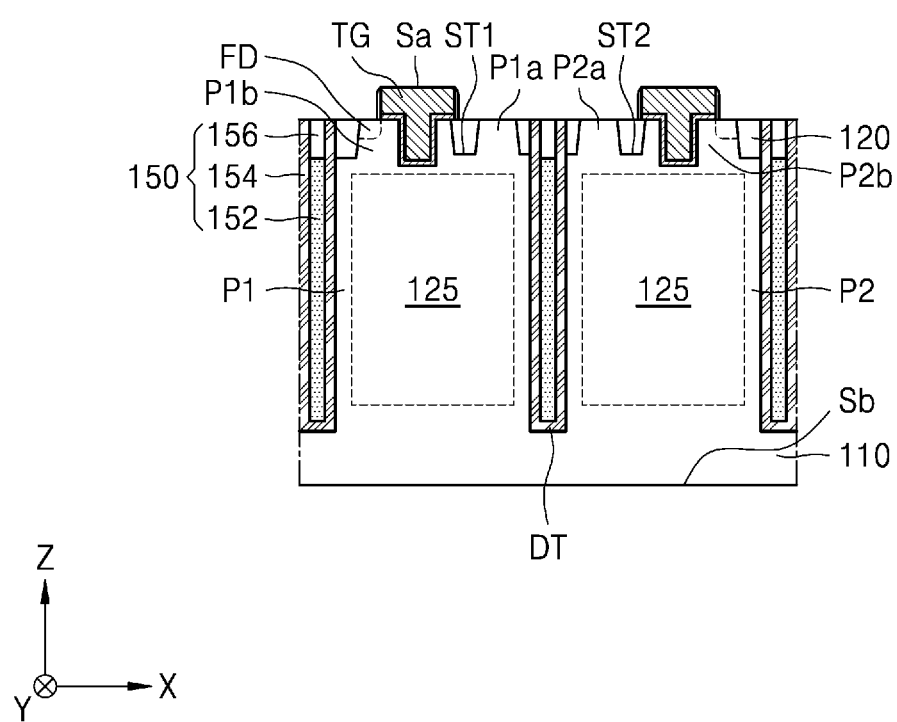
Figure 13:
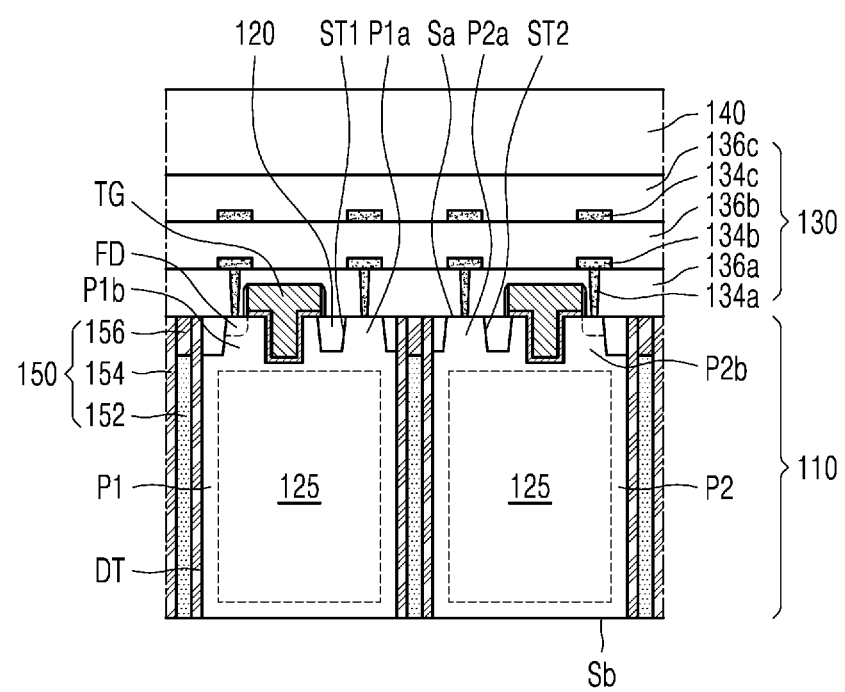

FIGS. 7A to 13 are diagrams for describing a method of manufacturing an image sensor, according to embodiments of the present inventive concepts. FIGS. 7A, 8A, 10A, 11A, and 12A are plan views each illustrating a method of manufacturing an image sensor, according to embodiments of the present inventive concepts. FIGS. 7B, 8B, 10B, 11B, and 12B are cross-sectional views taken along a line A-A' of FIGS. 7A, 8A, 10A, 11A, and 12A, respectively. FIGS. 9 and 13 are cross-sectional views each illustrating a method of manufacturing an image sensor, according to embodiments of the present inventive concepts. FIG. 8C is a plan view illustrating a mask M used in the steps shown in FIGS. 8A and 8B.

Referring to the embodiments of FIGS. 7A and 7B, a substrate 110 having a first surface Sa and a second surface Sb facing each other may be provided. In an embodiment, the substrate 110 may be of a first conductivity type (e.g., p-type). Photoelectric conversion regions 125 may be formed in the substrate 110. In an embodiment, the photoelectric conversion regions 125 may be formed by doping the substrate 110 with impurities of a second conductivity type (e.g., n-type).

Further, a mask layer may be formed on the first surface Sa of the substrate 110, In an embodiment, the mask layer may include silicon nitride, silicon oxide, or a combination thereof. In an embodiment, the mask layer may be patterned using photolithography. For example, a photoresist layer is formed on a mask layer, light is selectively exposed to the photoresist layer, and the photoresist layer is developed so that a photoresist pattern may be formed on the mask layer. The mask pattern MP may be formed by etching and patterning a mask layer using a photoresist pattern as an etching mask. A first step shallow trench STa may be formed by etching and patterning the substrate 110 using the mask pattern MP as an etching mask. The first step shallow trench STa extends into the substrate 110 from the first surface Sa of the substrate 110 and may only partially penetrate the substrate 110 by not extending to a second surface Sb of the substrate 110 that is opposite to the first surface Sa. The first step shallow trench STa may define a plurality of additional patterns, such as first to fourth additional patterns P1b, P2b, P3b, and P4b and a preliminary pattern Pa.

Referring to FIGS. 8A to 8C, a photoresist layer is formed on the mask pattern MP. The photoresist layer is selectively exposed to light by using a mask NI having a plurality of opening parts OP. The photoresist layer is developed to form a photoresist pattern. A second step shallow trench STb may be formed by etching the mask pattern MP and the substrate 110 using the photoresist pattern as an etching mask. The second step shallow trench STb may divide the preliminary pattern Pa shown in the embodiments of FIGS. 7A and 7B into a plurality of patterns, such as first to fourth patterns P1a to P4a.

While the embodiment of FIG. 8C shows the mask M having a shape comprising four squares, embodiments of the present inventive concepts are not limited thereto. For example, it will be apparent to a person skilled in the art that the shape of the mask shown in FIG. 8C is merely exemplary and may be changed to a pattern having a more accurate shape. Also, depending on the type of photoresist used, the shape of the mask may be reversed.

According to the manufacturing method of the present inventive concepts, by first forming the preliminary pattern Pa (see FIGS. 7A and 7B), each of the patterns, such as the first to fourth patterns P1a to P4a, may be formed to have at least one corner having a smaller radius of curvature in a plan view than when the plurality of patterns P1a to P4b are formed directly. In addition, since the area (e.g., in a plane defined in the X and Y directions) of the preliminary pattern Pa (see FIGS. 7A and 7B) is greater than the area (e.g., in a plane defined in the X and Y directions) of each of the first to fourth patterns P1a to P4a, to form the preliminary pattern Pa (see FIGS. 7A and 7B), the aspect ratio (height/area) of the photoresist pattern formed on the preliminary pattern Pa (see FIGS. 7A and 7B) may be reduced. Accordingly, the photoresist pattern may be prevented from leaning or lifting. Accordingly, the yield of the process of forming the plurality of patterns, such as the first to fourth patterns P1a to P4b, may be increased, compared to a comparative embodiment in which the plurality of patterns P1a to P4b are directly formed in only one patterning step.

In the present inventive concepts, an embodiment in which the preliminary pattern (Pa, see FIGS. 7A and 7B) is divided into four patterns P1a to P4a is shown. However, embodiments of the present inventive concepts are not limited thereto. For example, to manufacture the embodiments shown in FIGS. 4A to 6B, one preliminary pattern may be divided into two patterns. For example, in an embodiment, the embodiments shown in FIGS. 3A and 3B may be formed by separating the first pattern P1a-2 and the second pattern P2a-2 from a first preliminary pattern, and separating the third pattern P3a-2 and the fourth pattern P4a-2 from a second preliminary pattern that is different from the first preliminary pattern. In addition, in the embodiments shown in FIGS. 4A and 4B, the first pattern P1a-3 and the second pattern P2a-3 may be separated from a first preliminary pattern, and the third pattern P3a-3 and the fourth pattern P4a-3 may be separated from a second preliminary pattern that is different from the first preliminary pattern. In addition, in the embodiment shown in the embodiments of FIGS. 5A and SB, the first pattern P1a-4 and the third pattern P3a-4 may be separated from a first preliminary pattern, and the second pattern P2a-4 and the fourth pattern P4a-4 may be separated from a second preliminary pattern that is different from the first preliminary pattern. In addition, in the embodiments shown in FIGS. 6A and 6B, the first pattern P1a-5 and the third pattern P3a-5 may be separated from a first preliminary pattern, and the second pattern P2a-5 and the fourth pattern P4a-5 may be separated from a second preliminary pattern that is different from the first preliminary pattern.

Referring to the embodiment of FIG. 9, an element separation film 120 may be formed on the substrate 110 and the mask pattern MP. In an embodiment, the element separation film 120 may fill the first step shallow trench STa and the second step shallow trench STb. For example, the element separation film 120 may completely fill the first step shallow trench Sta and the second step shallow trench STb.

Figure 10A:
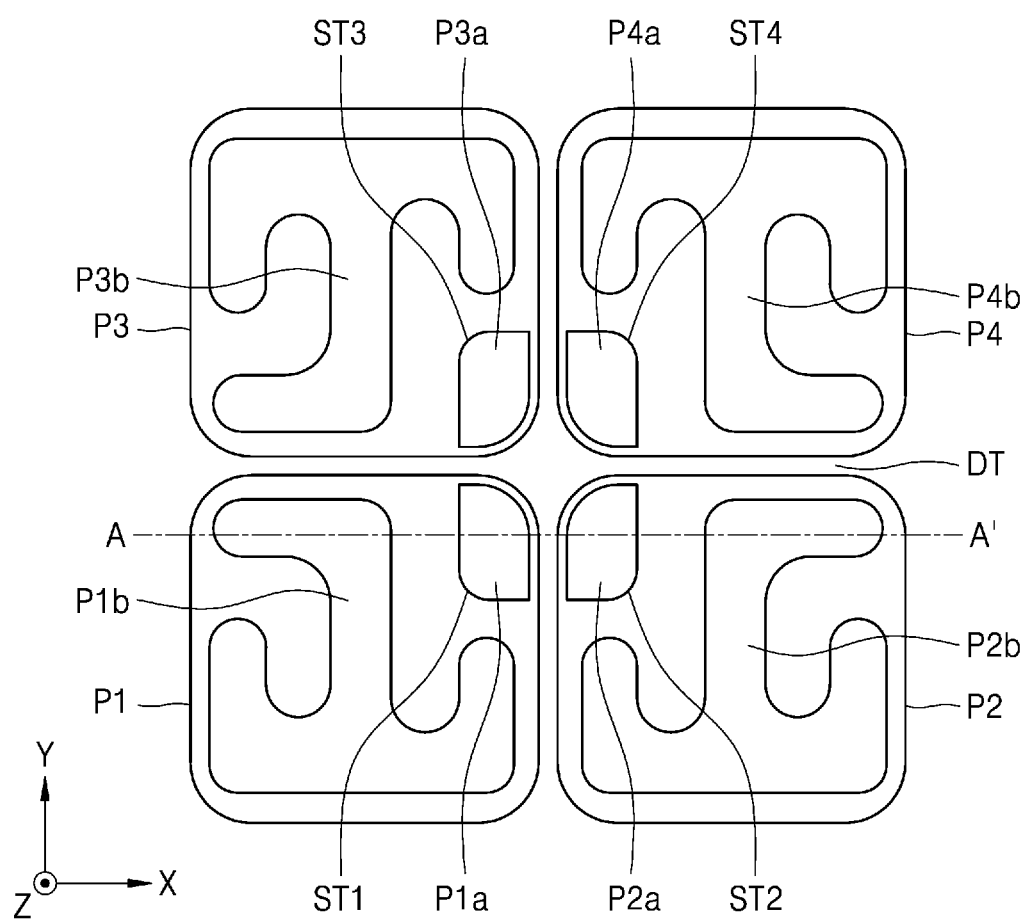
Figure 10B:
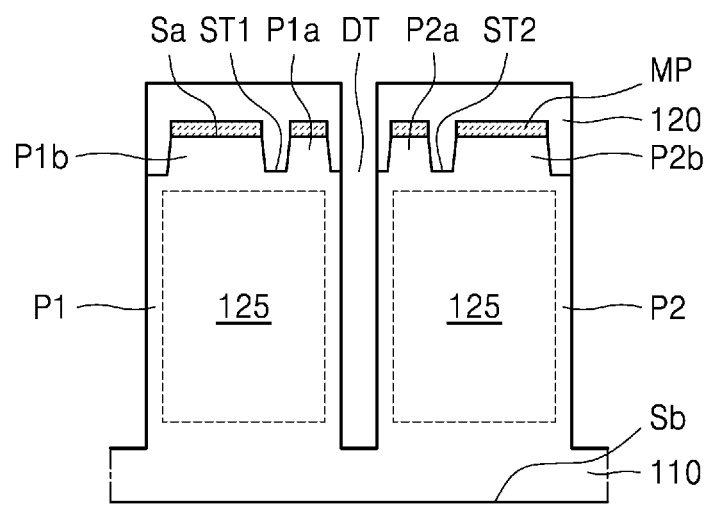

Referring to the embodiments of FIGS. 10A and 10B, a deep trench DT may be formed in the substrate 110. For example, in an embodiment, a photoresist layer may be formed on the element separation film 120. The photoresist layer is selectively exposed to light using the mask M shown in the embodiment of FIG. 8C, which was used to form the second step shallow trench STb shown in FIGS. 8A and 8B, and a photoresist pattern may be formed by developing the photoresist layer (not shown). A deep trench DT may be formed by etching the substrate 110 and the element separation film 120 using a photoresist pattern.

The second step shallow trench STb shown in FIGS. 8A and SB and the deep trench DT shown in FIGS. 10A and 10B are formed by using the same mask M shown in FIG. 8C, but by varying the exposure time of the step for forming the second step shallow trench STb shown in FIGS. 8A and 8B and the exposure time of the step for forming the deep trench DT shown in FIGS. 10A and 10B, in a plan view, the deep trench DT may be formed to be separated from the plurality of patterns P1a to P4a. That is, in a plan view, the plurality of patterns P1a to P4a may be completely defined by the first and second step shallow trenches STa and STb shown in FIGS. 8A and 8B. In another embodiment, as illustrated in FIG. 2A, the deep trench DT may be formed to define a partial portion of each of the patterns P1a to P4a.

The deep trench DT may define a plurality of pixel regions, such as first to fourth pixel regions P1 to P4, in the substrate 110. The deep trench DT may not completely penetrate the substrate 110. For example, a partial portion of the substrate 110 may remain between the second surface Sb of the substrate 110 and the deep trench DT.

The first and second step shallow trenches STa and STb defining the first pattern P1a and the first additional pattern P1b shown in FIGS. 8A and SB may be redefined as the first shallow trench ST1. The first and second step shallow trenches STa and STb defining the second pattern P2a and the second additional pattern P2b illustrated in the embodiments of FIGS. 8A and 8B may be redefined as the second shallow trench ST2. The first and second step shallow trenches STa and STb defining the third pattern P1a and the third additional pattern P3b illustrated in the embodiments of FIGS. 8A and 8B may be redefined as the third shallow trench ST3. The first and second step shallow trenches STa and STb defining the fourth pattern P4a and the fourth additional pattern P4b shown in the embodiments of FIGS. 8A and 8B may be redefined as the fourth shallow trench ST4.

Referring to the embodiments of FIGS. 11A and 11B, a pixel separation structure 150 may be formed in the deep trench DT. For example, in an embodiment, an insulating pattern 154 may be formed on the deep trench DT. A conductive pattern 152 may then be formed on the insulating pattern 154 to fill the deep trench DT. After removing the upper part of the conductive pattern 152, a capping pattern 156 may be formed on the conductive pattern 152. The mask pattern MP shown in the embodiment of FIG. 10B may then be removed so that the first surface Sa of the substrate 110 is exposed, and the element separation film 120 may be planarized.

Referring to the embodiments of FIGS. 12A and 12B, a plurality of transistors may be formed on the substrate 110. For example, an active region and a floating diffusion region FD may be formed by partially doping the substrate 110, and a transfer gate TG, a reset gate RG, a driver gate SF, and a selection gate SG may be formed on the substrate 110.

Referring to the embodiment of FIG. 13, a front structure 130 may be formed on the first surface Sa of the substrate 110 (e.g., directly thereon in the Z direction). For example, a first insulating layer 136a may be formed on the first surface Sa of the substrate 110, a plurality of contacts 134a penetrating through the first insulating layer 136a may be formed, a first wiring layer 134b may be formed on the first insulating layer 136a (e.g., directly thereon in the Z direction), a second insulating layer 136b may be formed on the first insulating layer 136a and the first wiring layer 134b (e.g., directly thereon in the Z direction), a second wiring layer 134c may be formed on the second insulating layer 136b (e.g., directly thereon in the Z direction), and a third insulating layer 136c may be formed on the second wiring layer 134c and the second insulating layer 136b (e.g., directly thereon in the Z direction). Thereafter, the support substrate 140 may be adhered to the front structure 130.

In an embodiment, the second surface Sb of the substrate 110 may be polished so that the conductive pattern 152 of the pixel separation structure 150 is exposed through the second surface Sb of the substrate 110. Accordingly, the deep trench DT may extend from the first surface Sa to the second surface Sb of the substrate 110.

Referring to the embodiment of FIG. 1C, a rear anti-reflection layer 161 may be formed on the second surface Sb of the substrate 110 and the pixel separation structure 150 (e.g., directly thereon in the Z direction). A fence 163 may then be formed on the rear anti-reflection layer 161. A color filter 170 may then be formed on the rear anti-reflection layer 161 (e.g., directly thereon in the Z direction). The microlens 180 may then be formed on the color filter 170 and the fence 163 (e.g., directly thereon in the Z direction). A capping layer 190 may then be formed on the microlens 180 (e.g., directly thereon in the Z direction). As a result, the image sensor 100 shown in the embodiment of FIG. 1C may be completely formed.

Figure 14A:
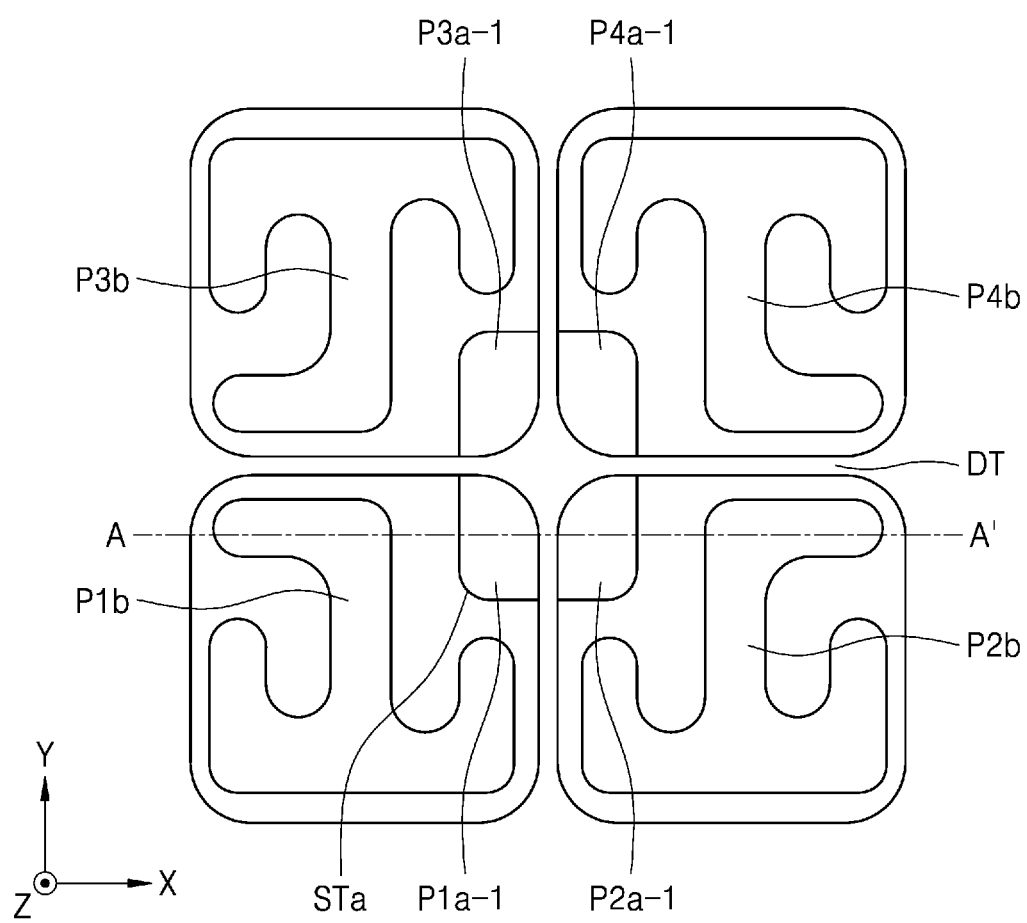
FIGS. 14A and 14B are diagrams for describing a method of manufacturing an image sensor, according to embodiments of the present inventive concepts.
Figure 14B:
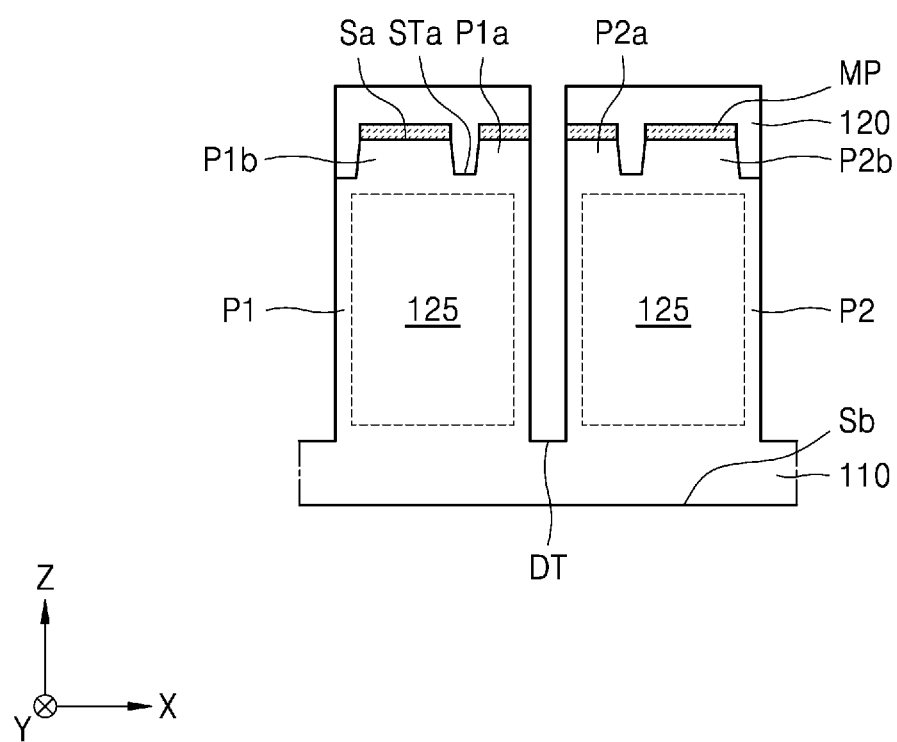

FIGS. 14A and 14B are diagrams for describing a method of manufacturing an image sensor, according to embodiments of the present inventive concepts. FIG. 14A is a plan view illustrating a method of manufacturing an image sensor, according to an embodiment of the present inventive concepts. FIG. 14B is a cross-sectional view taken along a line A14-A14' in FIG. 14A.

Referring to the embodiments of FIGS. 14A and 14B, a first step shallow trench STa may be formed according to the steps illustrated in FIGS. 7A and 7B. The element separation film 120 may be formed on the mask pattern MP on the first surface Sa of the substrate 110 and in the first step shallow trench STa. A deep trench DT may then be formed using the mask M illustrated in FIG. 8C. The deep trench DT may divide the preliminary pattern Pa formed in the steps illustrated in FIGS. 7A and 7B into a plurality of patterns, such as first to fourth patterns P1a-1 to P4a-1. For example, the deep trench DT may define a partial portion of each of the patterns P1a-1 to P4a-1. Thereafter, the steps described with reference to the embodiments of FIGS. 11A to 13 and 1C may be performed. As a result, the image sensor 100-1 shown in FIGS. 2A to 2C may be manufactured.

While the present inventive concepts have been particularly shown and described with reference to non-limiting embodiments thereof, it will be understood that various changes in form and details may be made therein without departing from the spirit and scope of the present inventive concepts.

What is claimed is:

1. An image sensor comprising:
   a substrate having a first surface and a second surface facing each other;
   a deep trench extending from the first surface to the second surface of the substrate and configured to define a pixel region within the substrate;
   a photoelectric conversion region disposed within the pixel region; and
   a shallow trench extending from the first surface of the substrate into the substrate and configured to at least partially define a pattern within the pixel region,
   wherein, in a plan view, the pattern has a first corner, a second corner facing the first corner in a first diagonal direction, a third corner, and a fourth corner facing the third corner in a second diagonal direction that crosses the first diagonal direction,
   wherein, in the plan view, a radius of curvature of the third corner is less than a radius of curvature of the first corner.

2. The image sensor of claim 1, wherein, in the plan view, the radius of curvature of the third corner is less than a radius of curvature of the second corner.

3. The image sensor of claim 1, wherein, in the plan view, a radius of curvature of the fourth corner is less than the radius of curvature of the first corner, and the radius of curvature of the fourth corner is less than a radius of curvature of the second corner.

4. The image sensor of claim 1, wherein the pattern is electrically grounded.

5. The image sensor of claim 1, wherein the deep trench further defines a partial portion of the pattern.

6. The image sensor of claim 1, wherein the shallow trench further defines an additional pattern within the pixel region,
wherein, in the plan view, a shortest distance between the pattern and the deep trench is less than a shortest distance between the pattern and the additional pattern.

7. The image sensor of claim 1, wherein the shallow trench further defines an additional pattern within the pixel region,
wherein, in the plan view, a shortest distance between the pattern and the deep trench is less than a shortest distance between the additional pattern and the deep trench.

8. The image sensor of claim 1, wherein, in the plan view, an edge extending between the second corner and the third corner is substantially parallel to an edge of the deep trench.

9. The image sensor of claim 1, wherein a shape of the pattern is square in the plan view.

10. The image sensor of claim 1, wherein, in the plan view, an area of the pattern is less than about 25% of an area of the pixel region.

11. An image sensor comprising:
a substrate having a first surface and a second surface facing each other;
a deep trench extending from the first surface to the second surface of the substrate and configured to define a first pixel region within the substrate;
a first photoelectric conversion region disposed within the first pixel region; and
a first shallow trench extending from the first surface of the substrate into the substrate and configured to at least partially define a first pattern in the first pixel region,
wherein, in a plan view, the first pattern comprises a first corner, a second corner separated from the first corner in a first horizontal direction, a third corner separated from the first corner in a second horizontal direction that crosses the first horizontal direction, and a fourth corner separated from the second corner in the second horizontal direction and separated from the third corner in the first horizontal direction,
wherein, in the plan view, a radius of curvature of the second corner is less than a radius of curvature of the first corner.

12. The image sensor of claim 11, wherein, in the plan view, the radius of curvature of the second corner is less than a radius of curvature of the third corner.

13. The image sensor of claim 11, wherein, in the plan view, the radius of curvature of the second corner is less than a radius of curvature of the fourth corner.

14. The image sensor of claim 11, wherein, in the plan view, a radius of curvature of the fourth corner is less than a radius of curvature of the first corner, and the radius of curvature of the fourth corner is less than a radius of curvature of the third corner.

15. The image sensor of claim 11, wherein, in the plan view, a first edge extending between the second and fourth corners is substantially parallel to an edge of the deep trench.

16. The image sensor of claim 11, wherein a shortest distance in the first horizontal direction from a first edge extending between the second corner and the fourth corner to the deep trench is less than a shortest distance in the second horizontal direction from a second edge extending between the third corner and the fourth corner to the deep trench.

17. The image sensor of claim 11, wherein, in the plan view, a shortest distance in the first horizontal direction from a first edge extending between the second corner and the fourth corner to the deep trench is less than a shortest distance in the first horizontal direction from a third edge extending between the first corner and the third corner to the deep trench.

18. The image sensor of claim 11, wherein the deep trench further defines a second pixel region separated from the first pixel region in the first horizontal direction in the substrate,
wherein the image sensor comprises:
a second photoelectric conversion region disposed within the second pixel region; and
a second shallow trench extending from the first surface of the substrate into the substrate and configured to at least partially define a second pattern in the second pixel region,
wherein, in the plan view, the second pattern comprises a fifth corner, a sixth corner separated from the fifth corner in the first horizontal direction, a seventh corner separated from the fifth corner in the second horizontal direction, and an eighth corner separated from the sixth corner in the second horizontal direction and separated from the seventh corner in the first horizontal direction,
wherein, in the plan view, a radius of curvature of the fifth corner is less than a radius of curvature of the sixth corner.

19. The image sensor of claim 18, wherein the first pattern and the second pattern are symmetric with respect to a center line,
wherein the center line passes between the first pixel region and the second pixel region in the second horizontal direction.

20. An image sensor comprising:
a substrate having a first pixel region, a second pixel region separated from the first pixel region in a first horizontal direction, a third pixel region separated from the first pixel region in a second horizontal direction that crosses the first horizontal direction, and a fourth pixel region separated from the second pixel region in the second horizontal direction and separated from the third pixel region in the first horizontal direction;
a pixel separation structure configured to define the first to fourth pixel regions;
first to fourth photoelectric conversion regions respectively disposed within the first to fourth pixel regions; and
a device isolation layer configured to define first to fourth patterns in the first to fourth pixel regions, respectively,
wherein, in a plan view, each of the first to fourth patterns comprises a first corner, a second corner separated from the first corner in the first horizontal direction, a third corner separated from the first corner in the second horizontal direction, and a fourth corner separated from the second corner in the second horizontal direction and separated from the third corner in the first horizontal direction,
wherein a radius of curvature of the second corner of the first pattern and a radius of curvature of the third corner of the first pattern are less than a radius of curvature of the first corner of the first pattern and a radius of curvature of the fourth corner of the first pattern, wherein a radius of curvature of the first corner of the second pattern and a radius of curvature of the fourth corner of the second pattern are less than a radius of curvature of the second corner of the second pattern and a radius of curvature of the third corner of the second pattern, wherein a radius of curvature of the first corner of the third pattern and a radius of curvature of the fourth corner of the third pattern are less than a radius of curvature of the second corner of the third pattern and a radius of curvature of the third corner of the third pattern, wherein a radius of curvature of the second corner of the fourth pattern and a radius of curvature of the third corner of the fourth pattern are less than a radius of curvature of the first corner of the fourth pattern and a radius of curvature of the fourth corner of the fourth pattern.

* * * * *